US011038624B2

(12) United States Patent
Chen et al.

(10) Patent No.: US 11,038,624 B2
(45) Date of Patent: Jun. 15, 2021

(54) USER-SPECIFIC SCRAMBLING FOR POLAR CODES

(71) Applicants: Qualcomm Incorporated, San Diego, CA (US); Kai Chen, Shenzhen (CN); Changlong Xu, Beijing (CN); Jing Jiang, San Diego, CA (US); Gabi Sarkis, San Diego, CA (US); Hao Xu, Beijing (CN)

(72) Inventors: Kai Chen, Shenzhen (CN); Changlong Xu, Beijing (CN); Jing Jiang, San Diego, CA (US); Gabi Sarkis, San Diego, CA (US); Hao Xu, Beijing (CN)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 16/764,957

(22) PCT Filed: Nov. 17, 2017

(86) PCT No.: PCT/CN2017/111630
§ 371 (c)(1),
(2) Date: May 18, 2020

(87) PCT Pub. No.: WO2019/095279
PCT Pub. Date: May 23, 2019

(65) Prior Publication Data
US 2020/0403728 A1    Dec. 24, 2020

(51) Int. Cl.
*H04L 1/00* (2006.01)

(52) U.S. Cl.
CPC .......... *H04L 1/0057* (2013.01); *H04L 1/0061* (2013.01); *H04L 1/0071* (2013.01)

(58) Field of Classification Search
CPC .... H04L 1/0057; H04L 1/0061; H04L 1/0071
See application file for complete search history.

(56) References Cited

U.S. PATENT DOCUMENTS

| 2013/0195275 A1 | 8/2013 | Koivisto et al. |
| 2014/0195880 A1 | 7/2014 | Varadarajan et al. |
| 2016/0013810 A1* | 1/2016 | Gross .................... H03M 13/13 714/776 |

FOREIGN PATENT DOCUMENTS

CN          103036645 A        4/2013

OTHER PUBLICATIONS

International Search Report and Written Opinion—PCT/CN2017/111630—ISA/EPO—dated Aug. 8, 2018.

* cited by examiner

*Primary Examiner* — Curtis B Odom
(74) *Attorney, Agent, or Firm* — Holland & Hart LLP

(57) ABSTRACT

A transmitting device may identify a set of bit locations of a polar code for encoding an input vector based at least in part on a reliability order of the bit locations, where the input vector includes a set of payload bits. The transmitting device may map bits of the input vector to respective bit locations of the identified set of bit locations and may apply a masking operation to a subset of bits of the input vector that is mapped to a most reliable subset of the set of bit locations. The transmitting device may perform an encoding operation according to the mapped input vector to generate a codeword for transmission. A receiving device may perform complementary operations to obtain the payload bits of the input vector. Based on the described techniques, a false alarm rate for the receiving device may be suppressed.

52 Claims, 19 Drawing Sheets

| Candidates 525 | Metrics 530 | |
|---|---|---|
| 0 0 0 ••• 0 0 0 1 0 | 0.0 | } 510 |
| 0 1 0 ••• 0 0 0 1 0 | -0.5 | |
| 0 0 1 ••• 0 0 0 1 0 | -10.2 | |
| 0 0 0 ••• 1 0 0 0 0 | -12.3 | |
| 0 0 0 ••• 0 0 1 0 0 | -15.2 | } 515 |
| 0 0 0 ••• 0 0 0 0 1 | -16.1 | |
| 0 0 0 ••• 1 0 0 0 1 | -20.8 | |
| 0 0 0 ••• 0 0 0 0 0 | -110.9 | } 520 |

605 ⌐·─·⌐ Decoding Order Bit Mask
610 ▢ Reliability Order Bit Mask

US 11,038,624 B2

USER-SPECIFIC SCRAMBLING FOR POLAR CODES

CROSS REFERENCE

The present Application is a 371 national phase filing of International Patent Application No. PCT/CN2017/111630 to Chen et al. entitled "USER-SPECIFIC SCRAMBLING FOR POLAR CODES," filed Nov. 17, 2017, assigned to the assignee hereof.

BACKGROUND

The following relates generally to wireless communication, and more specifically to user-specific scrambling for polar codes.

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include fourth generation (4G) systems such as a Long Term Evolution (LTE) systems or LTE-Advanced (LTE-A) systems, and fifth generation (5G) systems which may be referred to as New Radio (NR) systems. These systems may employ technologies such as code division multiple access (CDMA), time division multiple access (TDMA), frequency division multiple access (FDMA), orthogonal frequency division multiple access (OFDMA), or discrete Fourier transform-spread-OFDM (DFT-S-OFDM).

A wireless multiple-access communications system may include a number of base stations or network access nodes, each simultaneously supporting communication for multiple communication devices, which may be otherwise known as user equipment (UE). In some such systems, the communications for the multiple devices may be multiplexed over the same set of wireless resources. Such multiplexing may improve spectral utilization, increase throughput, or otherwise benefit the systems. However, complications may arise when a wireless device mistakenly interprets a transmission intended for another device as being intended for itself. This issue, which may be referred to as a false alarm or false positive, may unnecessarily consume power at the unintended recipient or may otherwise negatively impact communications within the system. Improved techniques for suppressing the false alarm rate of a wireless system may be desired.

SUMMARY

The described techniques relate to improved methods, systems, devices, or apparatuses that support user-specific scrambling for polar codes. Generally, the described techniques provide for suppression of false alarm rates associated with transmissions that use linear block error-correcting codes (e.g., polar codes). Specifically, in accordance with the described techniques a transmitting wireless device such as a base station may apply a masking operation that is specific to an intended recipient to a most reliable set of bit positions within an encoding operation. For example, the masking operation may include application of a radio network temporary identifier (RNTI) to the most reliable set of bit positions of the encoding operation, where applying the masking operation comprises performing a bit-wise exclusive-or (XOR) operation between bit positions of the RNTI and corresponding bit positions of the most reliable set of bit positions. By applying the masking operation to the most reliable set of bit positions (e.g., instead of to bit positions that are identified based on a decoding order of the linear block code), a transmitting device may suppress false alarm rates for unintended recipients. That is, an unintended recipient (when applying a masking operation specific to itself) may determine that the codeword is not intended for it with greater reliability than would be otherwise possible (e.g., without using the techniques described herein).

A method of wireless communication is described. The method may include identifying a set of bit locations of a polar code for encoding an input vector based at least in part on a reliability order of the bit locations, wherein the input vector comprises a set of payload bits and a set of error detecting check bits, mapping bits of the input vector to respective bit locations of the set of the bit locations, applying a masking operation to a subset of bits of the input vector that is mapped to a most reliable subset of the set of the bit locations, wherein the subset of bits of the input vector comprises at least one bit of the set of payload bits, performing an encoding operation according to the mapped input vector to generate a codeword, and transmitting the codeword to a second wireless device.

An apparatus for wireless communication is described. The apparatus may include means for identifying a set of bit locations of a polar code for encoding an input vector based at least in part on a reliability order of the bit locations, wherein the input vector comprises a set of payload bits and a set of error detecting check bits, means for mapping bits of the input vector to respective bit locations of the set of the bit locations, means for applying a masking operation to a subset of bits of the input vector that is mapped to a most reliable subset of the set of the bit locations, wherein the subset of bits of the input vector comprises at least one bit of the set of payload bits, means for performing an encoding operation according to the mapped input vector to generate a codeword, and means for transmitting the codeword to a second wireless device.

Another apparatus for wireless communication is described. The apparatus may include a processor, memory in electronic communication with the processor, and instructions stored in the memory. The instructions may be operable to cause the processor to identify a set of bit locations of a polar code for encoding an input vector based at least in part on a reliability order of the bit locations, wherein the input vector comprises a set of payload bits and a set of error detecting check bits, map bits of the input vector to respective bit locations of the set of the bit locations, apply a masking operation to a subset of bits of the input vector that is mapped to a most reliable subset of the set of the bit locations, wherein the subset of bits of the input vector comprises at least one bit of the set of payload bits, perform an encoding operation according to the mapped input vector to generate a codeword, and transmit the codeword to a second wireless device.

A non-transitory computer-readable medium for wireless communication is described. The non-transitory computer-readable medium may include instructions operable to cause a processor to identify a set of bit locations of a polar code for encoding an input vector based at least in part on a reliability order of the bit locations, wherein the input vector comprises a set of payload bits and a set of error detecting check bits, map bits of the input vector to respective bit locations of the set of the bit locations, apply a masking operation to a subset of bits of the input vector that is mapped to a most reliable subset of the set of the bit locations, wherein the subset of bits of the input vector comprises at least one bit of the set of payload bits, perform an encoding operation according to the mapped input vector to generate a codeword, and transmit the codeword to a second wireless device.

Some examples of the method, apparatus, and non-transitory computer-readable medium described above may further include processes, features, means, or instructions for interleaving the set of payload bits with the set of error detecting check bits to generate the input vector.

In some examples of the method, apparatus, and non-transitory computer-readable medium described above, the mapping comprises: mapping the bits of the input vector to the respective bit locations of the set of the bit locations based at least in part on a decoding order of the set of the bit locations.

In some examples of the method, apparatus, and non-transitory computer-readable medium described above, a kernel of the masking operation may be based at least in part on an identifier of the second wireless device.

In some examples of the method, apparatus, and non-transitory computer-readable medium described above, the masking operation comprises an XOR operation between each bit of the kernel and a corresponding bit of the subset of bits of the input vector.

In some examples of the method, apparatus, and non-transitory computer-readable medium described above, the identifier of the second wireless device comprises a RNTI.

A method of wireless communication is described. The method may include receiving a codeword from a second wireless device, the codeword generated from an input vector according to a polar code, the input vector comprising a set of payload bits and a set of error detecting check bits, identifying a set of bit locations of the polar code for decoding the input vector based at least in part on a reliability order of the bit locations, applying a decoding operation to the codeword to generate one or more decoding candidates comprising respective representations of the input vector, applying, for each decoding candidate, a masking operation to a subset of bits of the representation of the input vector that is mapped to a most reliable subset of the set of the bit locations, wherein the subset of bits of the representation of the input vector comprises at least one bit of the set of payload bits, and determining a validity of the each decoding candidate based at least in part on a result of the masking operation for the each decoding candidate.

An apparatus for wireless communication is described. The apparatus may include means for receiving a codeword from a second wireless device, the codeword generated from an input vector according to a polar code, the input vector comprising a set of payload bits and a set of error detecting check bits, means for identifying a set of bit locations of the polar code for decoding the input vector based at least in part on a reliability order of the bit locations, means for applying a decoding operation to the codeword to generate one or more decoding candidates comprising respective representations of the input vector, means for applying, for each decoding candidate, a masking operation to a subset of bits of the representation of the input vector that is mapped to a most reliable subset of the set of the bit locations, wherein the subset of bits of the representation of the input vector comprises at least one bit of the set of payload bits, and means for determining a validity of the each decoding candidate based at least in part on a result of the masking operation for the each decoding candidate.

Another apparatus for wireless communication is described. The apparatus may include a processor, memory in electronic communication with the processor, and instructions stored in the memory. The instructions may be operable to cause the processor to receive a codeword from a second wireless device, the codeword generated from an input vector according to a polar code, the input vector comprising a set of payload bits and a set of error detecting check bits, identify a set of bit locations of the polar code for decoding the input vector based at least in part on a reliability order of the bit locations, apply a decoding operation to the codeword to generate one or more decoding candidates comprising respective representations of the input vector, apply, for each decoding candidate, a masking operation to a subset of bits of the representation of the input vector that is mapped to a most reliable subset of the set of the bit locations, wherein the subset of bits of the representation of the input vector comprises at least one bit of the set of payload bits, and determine a validity of the each decoding candidate based at least in part on a result of the masking operation for the each decoding candidate.

A non-transitory computer-readable medium for wireless communication is described. The non-transitory computer-readable medium may include instructions operable to cause a processor to receive a codeword from a second wireless device, the codeword generated from an input vector according to a polar code, the input vector comprising a set of payload bits and a set of error detecting check bits, identify a set of bit locations of the polar code for decoding the input vector based at least in part on a reliability order of the bit locations, apply a decoding operation to the codeword to generate one or more decoding candidates comprising respective representations of the input vector, apply, for each decoding candidate, a masking operation to a subset of bits of the representation of the input vector that is mapped to a most reliable subset of the set of the bit locations, wherein the subset of bits of the representation of the input vector comprises at least one bit of the set of payload bits, and determine a validity of the each decoding candidate based at least in part on a result of the masking operation for the each decoding candidate.

In some examples of the method, apparatus, and non-transitory computer-readable medium described above, the decoding operation comprises a list decoding operation and the one or more decoding candidates comprise a plurality of decoding candidates.

Some examples of the method, apparatus, and non-transitory computer-readable medium described above may further include processes, features, means, or instructions for de-mapping, for each decoding candidate, bits of the representation of the input vector to obtain a representation of the set of payload bits and a representation of the set of error detecting check bits based at least in part on a decoding order of the set of the bit locations.

Some examples of the method, apparatus, and non-transitory computer-readable medium described above may further include processes, features, means, or instructions for deinterleaving the representation of the input vector to obtain a representation of the set of payload bits and a representation of the set of error detecting check bits.

In some examples of the method, apparatus, and non-transitory computer-readable medium described above, a kernel of the masking operation may be based at least in part on an identifier of the wireless device.

In some examples of the method, apparatus, and non-transitory computer-readable medium described above, the masking operation comprises an XOR operation between each position of the kernel and a corresponding bit of the subset of bits of the representation of the input vector.

In some examples of the method, apparatus, and non-transitory computer-readable medium described above, the identifier of the wireless device comprises a RNTI.

BRIEF DESCRIPTION OF THE DRAWINGS

FIG. 6 illustrates an example of a reliability sequence 600 for a polar code that supports user-specific scrambling for polar codes in accordance with various aspects of the present disclosure.

DETAILED DESCRIPTION

Some wireless communications systems support communications which use linear block error-correcting codes, such as polar codes. The construction of a polar code is based on a multiple recursive concatenation of a short kernel code which transforms a given physical channel into a plurality of virtual bit channels. When the number of recursions becomes large, the bit channels tend to have either a high reliability or a low reliability (i.e., they become polarized). By allocating a payload of a transmission to more reliable bit channels, polar codes have approached the channel capacity for symmetric binary-input, discrete, memoryless channels as the code length increases. Further, polar codes have modest encoding and decoding complexity, which renders them attractive for many applications.

In some cases, a decoded codeword may be improperly classified as valid by an unintended receiving device. That is, the non-intended recipient may classify the codeword as valid and continue processing the codeword or may attempt to decode a subsequent transmission unnecessarily. For example, in cases in which the decoding operation produces multiple decoding candidates (e.g., successive cancellation list (SCL) decoding), each with an associated path metric, one or more of the decoding candidates may be improperly classified as valid (e.g., may be examples of false-positive candidates). These false positive candidates may unnecessarily consume processing resources and energy at a receiving device or may otherwise negatively impact a wireless system. Techniques are described herein for suppressing the incidence of such false-positive candidates. In accordance with the described techniques, a transmitting device may apply a masking operation that is specific to an intended recipient to a most reliable set of bit positions of the polar codeword (e.g., rather than applying the masking operation to a set of bit positions that are determined by a given decoding order of the polar codeword). By processing the most reliable set of bit positions (e.g., and applying a recipient-specific masking operation to these bit positions), a receiving device may terminate a decoding operation for codewords that are not intended for the receiving device (e.g., or may realize other decoding benefits) with greater accuracy than would otherwise be achievable.

Aspects of the disclosure are initially described in the context of a wireless communications system. Aspects of the disclosure are then illustrated by and described with reference to process flows and system diagrams. Aspects of the disclosure are further illustrated by and described with reference to apparatus diagrams, system diagrams, and flowcharts that relate to user-specific scrambling for polar codes.

Figure 1:
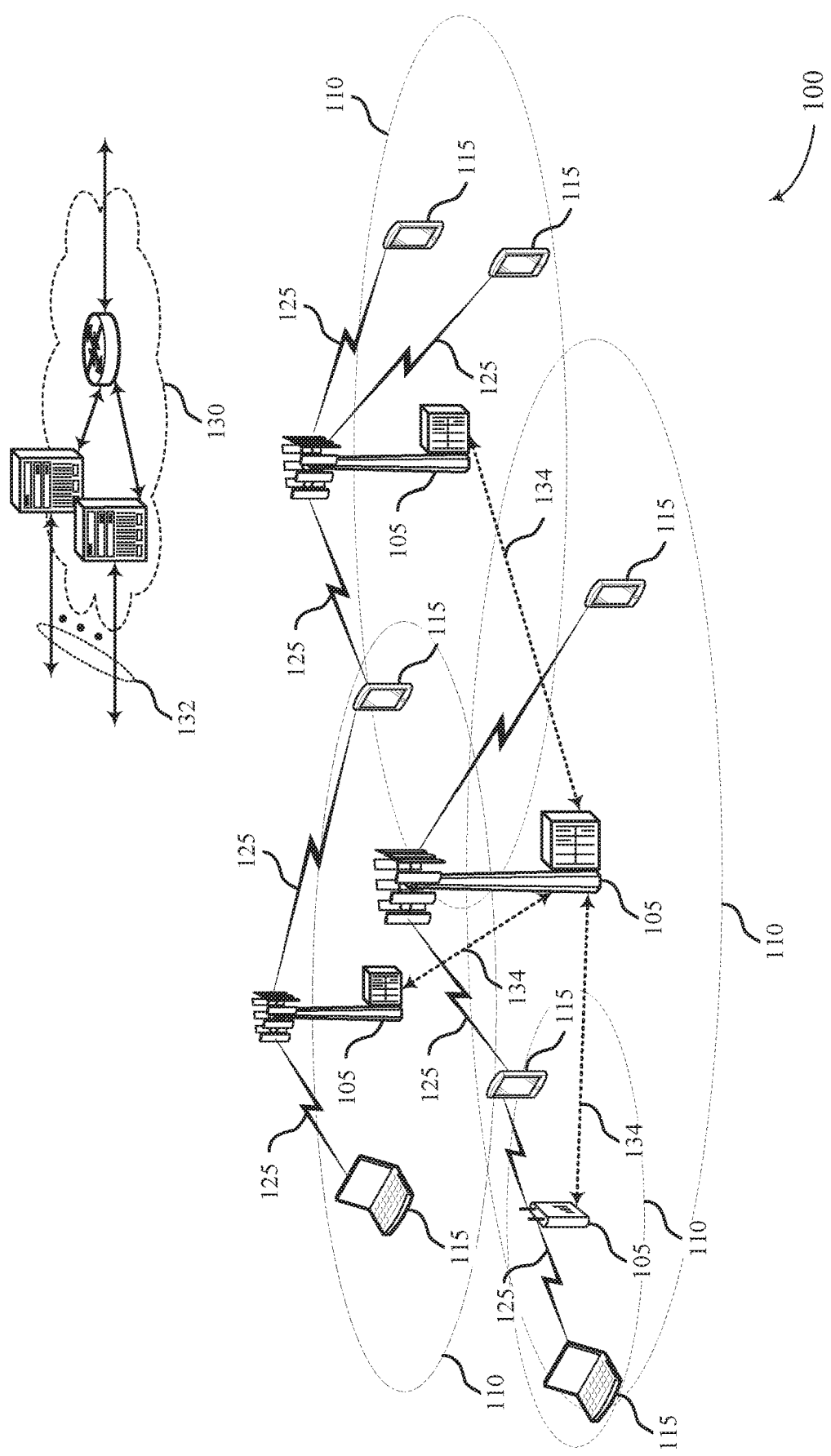
FIG. 1 illustrates an example of a system for wireless communication that supports user-specific scrambling for polar codes in accordance with aspects of the present disclosure.

FIG. 1 illustrates an example of a wireless communications system 100 in accordance with various aspects of the present disclosure. The wireless communications system 100 includes base stations 105, UEs 115, and a core network 130. In some examples, the wireless communications system 100 may be a LTE network, an LTE-A network, or a New Radio (NR) network. In some cases, wireless communications system 100 may support enhanced broadband communications, ultra-reliable (e.g., mission critical) communications, low latency communications, or communications with low-cost and low-complexity devices.

Base stations 105 may wirelessly communicate with UEs 115 via one or more base station antennas. Base stations 105 described herein may include or may be referred to by those skilled in the art as a base transceiver station, a radio base station, an access point, a radio transceiver, a NodeB, an eNodeB (eNB), a next-generation Node B or giga-nodeB (either of which may be referred to as a gNB), a Home NodeB, a Home eNodeB, or some other suitable terminology. Wireless communications system 100 may include base stations 105 of different types (e.g., macro or small cell base stations). The UEs 115 described herein may be able to communicate with various types of base stations 105 and network equipment including macro eNBs, small cell eNBs, gNBs, relay base stations, and the like.

Each base station 105 may be associated with a particular geographic coverage area 110 in which communications with various UEs 115 is supported. Each base station 105 may provide communication coverage for a respective geographic coverage area 110 via communication links 125, and communication links 125 between a base station 105 and a UE 115 may utilize one or more carriers. Communication links 125 shown in wireless communications system 100 may include uplink transmissions from a UE 115 to a base station 105, or downlink transmissions, from a base station 105 to a UE 115. Downlink transmissions may also be called forward link transmissions while uplink transmissions may also be called reverse link transmissions.

The geographic coverage area 110 for a base station 105 may be divided into sectors making up only a portion of the geographic coverage area 110, and each sector may be associated with a cell. For example, each base station 105 may provide communication coverage for a macro cell, a small cell, a hot spot, or other types of cells, or various combinations thereof. In some examples, a base station 105 may be movable and therefore provide communication coverage for a moving geographic coverage area 110. In some examples, different geographic coverage areas 110 associated with different technologies may overlap, and overlapping geographic coverage areas 110 associated with different technologies may be supported by the same base station 105 or by different base stations 105. The wireless communications system 100 may include, for example, a heterogeneous LTE/LTE-A or NR network in which different types of base stations 105 provide coverage for various geographic coverage areas 110.

The term "cell" refers to a logical communication entity used for communication with a base station 105 (e.g., over a carrier), and may be associated with an identifier for distinguishing neighboring cells (e.g., a physical cell identifier (PCID), a virtual cell identifier (VCID)) operating via the same or a different carrier. In some examples, a carrier may support multiple cells, and different cells may be configured according to different protocol types (e.g., machine-type communication (MTC), narrowband Internet-of-Things (NB-IoT), enhanced mobile broadband (eMBB), or others) that may provide access for different types of devices. In some cases, the term "cell" may refer to a portion of a geographic coverage area 110 (e.g., a sector) over which the logical entity operates.

UEs 115 may be dispersed throughout the wireless communications system 100, and each UE 115 may be stationary or mobile. A UE 115 may also be referred to as a mobile device, a wireless device, a remote device, a handheld device, or a subscriber device, or some other suitable terminology, where the "device" may also be referred to as a unit, a station, a terminal, or a client. A UE 115 may also be a personal electronic device such as a cellular phone, a personal digital assistant (PDA), a tablet computer, a laptop computer, or a personal computer. In some examples, a UE 115 may also refer to a wireless local loop (WLL) station, an Internet of Tings (IoT) device, an Internet of Everything (IoE) device, or an MTC device, or the like, which may be implemented in various articles such as appliances, vehicles, meters, or the like.

Some UEs 115, such as MTC or IoT devices, may be low cost or low complexity devices, and may provide for automated communication between machines (e.g., via Machine-to-Machine (M2M) communication). M2M communication or MTC may refer to data communication technologies that allow devices to communicate with one another or a base station 105 without human intervention. In some examples, M2M communication or MTC may include communications from devices that integrate sensors or meters to measure or capture information and relay that information to a central server or application program that can make use of the information or present the information to humans interacting with the program or application. Some UEs 115 may be designed to collect information or enable automated behavior of machines. Examples of applications for MTC devices include smart metering, inventory monitoring, water level monitoring, equipment monitoring, healthcare monitoring, wildlife monitoring, weather and geological event monitoring, fleet management and tracking, remote security sensing, physical access control, and transaction-based business charging.

Some UEs 115 may be configured to employ operating modes that reduce power consumption, such as half-duplex communications (e.g., a mode that supports one-way communication via transmission or reception, but not transmission and reception simultaneously). In some examples half-duplex communications may be performed at a reduced peak rate. Other power conservation techniques for UEs 115 include entering a power saving "deep sleep" mode when not engaging in active communications, or operating over a limited bandwidth (e.g., according to narrowband communications). In some cases, UEs 115 may be designed to support critical functions (e.g., mission critical functions), and a wireless communications system 100 may be configured to provide ultra-reliable communications for these functions.

In some cases, a UE 115 may also be able to communicate directly with other UEs 115 (e.g., using a peer-to-peer (P2P) or device-to-device (D2D) protocol). One or more of a group of UEs 115 utilizing D2D communications may be within the geographic coverage area 110 of a base station 105. Other UEs 115 in such a group may be outside the geographic coverage area 110 of a base station 105, or be otherwise unable to receive transmissions from a base station 105. In some cases, groups of UEs 115 communicating via D2D communications may utilize a one-to-many (1:M) system in which each UE 115 transmits to every other UE 115 in the group. In some cases, a base station 105 facilitates the scheduling of resources for D2D communications. In other cases, D2D communications are carried out between UEs 115 without the involvement of a base station 105.

Base stations 105 may communicate with the core network 130 and with one another. For example, base stations 105 may interface with the core network 130 through backhaul links 132 (e.g., via an S1 or other interface). Base stations 105 may communicate with one another over backhaul links 134 (e.g., via an X2, Xn, or other interface) either directly (e.g., directly between base stations 105) or indirectly (e.g., via core network 130).

The core network 130 may provide user authentication, access authorization, tracking, Internet Protocol (IP) connectivity, and other access, routing, or mobility functions. The core network 130 may be an evolved packet core (EPC), which may include at least one mobility management entity (MME), at least one serving gateway (S-GW), and at least one Packet Data Network (PDN) gateway (P-GW). The MME may manage non-access stratum (e.g., control plane) functions such as mobility, authentication, and bearer management for UEs 115 served by base stations 105 associated with the EPC. User IP packets may be transferred through the S-GW, which itself may be connected to the P-GW. The P-GW may provide IP address allocation as well as other functions. The P-GW may be connected to the network operators IP services. The operators IP services may include access to the Internet, Intranet(s), an IP Multimedia Subsystem (IMS), or a Packet-Switched (PS) Streaming Service.

At least some of the network devices, such as a base station 105, may include subcomponents such as an access network entity, which may be an example of an access node controller (ANC). Each access network entity may communicate with UEs 115 through a number of other access network transmission entities, which may be referred to as a radio head, a smart radio head, or a transmission/reception point (TRP). In some configurations, various functions of each access network entity or base station 105 may be distributed across various network devices (e.g., radio heads and access network controllers) or consolidated into a single network device (e.g., a base station 105).

Wireless communications system 100 may operate using one or more frequency bands, typically in the range of 300 MHz to 300 GHz. Generally, the region from 300 MHz to 3 GHz is known as the ultra-high frequency (UHF) region or decimeter band, since the wavelengths range from approximately one decimeter to one meter in length. UHF waves may be blocked or redirected by buildings and environmental features. However, the waves may penetrate structures sufficiently for a macro cell to provide service to UEs 115 located indoors. Transmission of UHF waves may be associated with smaller antennas and shorter range (e.g., less than 100 km) compared to transmission using the smaller frequencies and longer waves of the high frequency (HF) or very high frequency (VHF) portion of the spectrum below 300 MHz.

Wireless communications system 100 may also operate in a super high frequency (SHF) region using frequency bands from 3 GHz to 30 GHz, also known as the centimeter band. The SHF region includes bands such as the 5 GHz industrial, scientific, and medical (ISM) bands, which may be used opportunistically by devices that can tolerate interference from other users.

Wireless communications system 100 may also operate in an extremely high frequency (EHF) region of the spectrum (e.g., from 30 GHz to 300 GHz), also known as the millimeter band. In some examples, wireless communications system 100 may support millimeter wave (mmW) communications between UEs 115 and base stations 105, and EHF antennas of the respective devices may be even smaller and more closely spaced than UHF antennas. In some cases, this may facilitate use of antenna arrays within a UE 115. However, the propagation of EHF transmissions may be subject to even greater atmospheric attenuation and shorter range than SHF or UHF transmissions. Techniques disclosed herein may be employed across transmissions that use one or more different frequency regions, and designated use of bands across these frequency regions may differ by country or regulating body.

In some cases, wireless communications system 100 may utilize both licensed and unlicensed radio frequency spectrum bands. For example, wireless communications system 100 may employ License Assisted Access (LAA), LTE-Unlicensed (LTE-U) radio access technology, or NR technology in an unlicensed band such as the 5 GHz ISM band. When operating in unlicensed radio frequency spectrum bands, wireless devices such as base stations 105 and UEs 115 may employ listen-before-talk (LBT) procedures to ensure a frequency channel is clear before transmitting data. In some cases, operations in unlicensed bands may be based on a CA configuration in conjunction with CCs operating in a licensed band (e.g., LAA). Operations in unlicensed spectrum may include downlink transmissions, uplink transmissions, peer-to-peer transmissions, or a combination of these. Duplexing in unlicensed spectrum may be based on frequency division duplexing (FDD), time division duplexing (TDD), or a combination of both.

In some examples, base station 105 or UE 115 may be equipped with multiple antennas, which may be used to employ techniques such as transmit diversity, receive diversity, multiple-input multiple-output (MIMO) communications, or beamforming. For example, wireless communication system may use a transmission scheme between a transmitting device (e.g., a base station 105) and a receiving device (e.g., a UE 115), where the transmitting device is equipped with multiple antennas and the receiving devices are equipped with one or more antennas. MIMO communications may employ multipath signal propagation to increase the spectral efficiency by transmitting or receiving multiple signals via different spatial layers, which may be referred to as spatial multiplexing. The multiple signals may, for example, be transmitted by the transmitting device via different antennas or different combinations of antennas. Likewise, the multiple signals may be received by the receiving device via different antennas or different combinations of antennas. Each of the multiple signals may be referred to as a separate spatial stream, and may carry bits associated with the same data stream (e.g., the same codeword) or different data streams. Different spatial layers may be associated with different antenna ports used for channel measurement and reporting. MIMO techniques include single-user MIMO (SU-MIMO) where multiple spatial layers are transmitted to the same receiving device, and multiple-user MIMO (MU-MIMO) where multiple spatial layers are transmitted to multiple devices.

Beamforming, which may also be referred to as spatial filtering, directional transmission, or directional reception, is a signal processing technique that may be used at a transmitting device or a receiving device (e.g., a base station 105 or a UE 115) to shape or steer an antenna beam (e.g., a transmit beam or receive beam) along a spatial path between the transmitting device and the receiving device. Beamforming may be achieved by combining the signals communicated via antenna elements of an antenna array such that signals propagating at particular orientations with respect to an antenna array experience constructive interference while others experience destructive interference. The adjustment of signals communicated via the antenna elements may include a transmitting device or a receiving device applying certain amplitude and phase offsets to signals carried via each of the antenna elements associated with the device. The adjustments associated with each of the antenna elements may be defined by a beamforming weight set associated with a particular orientation (e.g., with respect to the antenna array of the transmitting device or receiving device, or with respect to some other orientation).

In one example, a base station 105 may use multiple antennas or antenna arrays to conduct beamforming operations for directional communications with a UE 115. For instance, some signals (e.g. synchronization signals, reference signals, beam selection signals, or other control signals) may be transmitted by a base station 105 multiple times in different directions, which may include a signal being transmitted according to different beamforming weight sets associated with different directions of transmission. Transmissions in different beam directions may be used to identify (e.g., by the base station 105 or a receiving device, such as a UE 115) a beam direction for subsequent transmission and/or reception by the base station 105. Some signals, such as data signals associated with a particular receiving device, may be transmitted by a base station 105 in a single beam direction (e.g., a direction associated with the receiving device, such as a UE 115). In some examples, the beam direction associated with transmissions along a single beam direction may be determined based at least in in part on a signal that was transmitted in different beam directions. For example, a UE 115 may receive one or more of the signals transmitted by the base station 105 in different directions, and the UE 115 may report to the base station 105 an indication of the signal it received with a highest signal quality, or an otherwise acceptable signal quality. Although these techniques are described with reference to signals transmitted in one or more directions by a base station 105, a UE 115 may employ similar techniques for transmitting signals multiple times in different directions (e.g., for identifying a beam direction for subsequent transmission or reception by the UE 115), or transmitting a signal in a single direction (e.g., for transmitting data to a receiving device).

A receiving device (e.g., a UE 115, which may be an example of a mmW receiving device) may try multiple receive beams when receiving various signals from the base station 105, such as synchronization signals, reference signals, beam selection signals, or other control signals. For example, a receiving device may try multiple receive directions by receiving via different antenna subarrays, by processing received signals according to different antenna subarrays, by receiving according to different receive beamforming weight sets applied to signals received at a plurality of antenna elements of an antenna array, or by processing received signals according to different receive beamforming weight sets applied to signals received at a plurality of antenna elements of an antenna array, any of which may be referred to as "listening" according to different receive beams or receive directions. In some examples a receiving device may use a single receive beam to receive along a single beam direction (e.g., when receiving a data signal). The single receive beam may be aligned in a beam direction determined based at least in part on listening according to different receive beam directions (e.g., a beam direction determined to have a highest signal strength, highest signal-to-noise ratio, or otherwise acceptable signal quality based at least in part on listening according to multiple beam directions).

In some cases, the antennas of a base station 105 or UE 115 may be located within one or more antenna arrays, which may support MIMO operations, or transmit or receive beamforming. For example, one or more base station antennas or antenna arrays may be co-located at an antenna assembly, such as an antenna tower. In some cases, antennas or antenna arrays associated with a base station 105 may be located in diverse geographic locations. A base station 105 may have an antenna array with a number of rows and columns of antenna ports that the base station 105 may use to support beamforming of communications with a UE 115. Likewise, a UE 115 may have one or more antenna arrays that may support various MIMO or beamforming operations.

In some cases, wireless communications system 100 may be a packet-based network that operate according to a layered protocol stack. In the user plane, communications at the bearer or Packet Data Convergence Protocol (PDCP) layer may be IP-based. A Radio Link Control (RLC) layer may in some cases perform packet segmentation and reassembly to communicate over logical channels. A Medium Access Control (MAC) layer may perform priority handling and multiplexing of logical channels into transport channels. The MAC layer may also use hybrid automatic repeat request (HARQ) to provide retransmission at the MAC layer to improve link efficiency. In the control plane, the Radio Resource Control (RRC) protocol layer may provide establishment, configuration, and maintenance of an RRC connection between a UE 115 and a base station 105 or core network 130 supporting radio bearers for user plane data. At the Physical (PHY) layer, transport channels may be mapped to physical channels.

In some cases, UEs 115 and base stations 105 may support retransmissions of data to increase the likelihood that data is received successfully. HARQ feedback is one technique of increasing the likelihood that data is received correctly over a communication link 125. HARQ may include a combination of error detection (e.g., using a cyclic redundancy check (CRC)), forward error correction (FEC), and retransmission (e.g., automatic repeat request (ARQ)). HARQ may improve throughput at the MAC layer in poor radio conditions (e.g., signal-to-noise conditions). In some cases, a wireless device may support same-slot HARQ feedback, where the device may provide HARQ feedback in a specific slot for data received in a previous symbol in the slot. In other cases, the device may provide HARQ feedback in a subsequent slot, or according to some other time interval.

Time intervals in LTE or NR may be expressed in multiples of a basic time unit, which may, for example, refer to a sampling period of $T_s=1/30,720,000$ seconds. Time intervals of a communications resource may be organized according to radio frames each having a duration of 10 milliseconds (ms), where the frame period may be expressed as $T_f=307,200\ T_s$. The radio frames may be identified by a system frame number (SFN) ranging from 0 to 1023. Each frame may include 10 subframes numbered from 0 to 9, and each subframe may have a duration of 1 ms. A subframe may be further divided into 2 slots each having a duration of 0.5 ms, and each slot may contain 6 or 7 modulation symbol periods (e.g., depending on the length of the cyclic prefix prepended to each symbol period). Excluding the cyclic prefix, each symbol period may contain 2048 sampling periods. In some cases a subframe may be the smallest scheduling unit of the wireless communications system 100, and may be referred to as a transmission time interval (TTI). In other cases, a smallest scheduling unit of the wireless communications system 100 may be shorter than a subframe or may be dynamically selected (e.g., in bursts of shortened TTIs (sTTIs) or in selected component carriers using sTTIs).

In some wireless communications systems, a slot may further be divided into multiple mini-slots containing one or more symbols. In some instances, a symbol of a mini-slot or a mini-slot may be the smallest unit of scheduling. Each symbol may vary in duration depending on the subcarrier spacing or frequency band of operation, for example. Further, some wireless communications systems may implement slot aggregation in which multiple slots or mini-slots are aggregated together and used for communication between a UE 115 and a base station 105.

The term "carrier" refers to a set of radio frequency spectrum resources having a defined physical layer structure for supporting communications over a communication link 125. For example, a carrier of a communication link 125 may include a portion of a radio frequency spectrum band that is operated according to physical layer channels for a given radio access technology. Each physical layer channel may carry user data, control information, or other signaling. A carrier may be associated with a pre-defined frequency channel (e.g., an E-UTRA absolute radio frequency channel number (EARFCN)), and may be positioned according to a channel raster for discovery by UEs 115. Carriers may be downlink or uplink (e.g., in an FDD mode), or be configured to carry downlink and uplink communications (e.g., in a TDD mode). In some examples, signal waveforms transmitted over a carrier may be made up of multiple sub-carriers (e.g., using multi-carrier modulation (MCM) techniques such as OFDM or DFT-s-OFDM).

The organizational structure of the carriers may be different for different radio access technologies (e.g., LTE, LTE-A, NR, etc.). For example, communications over a carrier may be organized according to TTIs or slots, each of which may include user data as well as control information or signaling to support decoding the user data. A carrier may also include dedicated acquisition signaling (e.g., synchronization signals or system information, etc.) and control signaling that coordinates operation for the carrier. In some examples (e.g., in a carrier aggregation configuration), a carrier may also have acquisition signaling or control signaling that coordinates operations for other carriers.

Physical channels may be multiplexed on a carrier according to various techniques. A physical control channel and a physical data channel may be multiplexed on a downlink carrier, for example, using time division multiplexing (TDM) techniques, frequency division multiplexing (FDM) techniques, or hybrid TDM-FDM techniques. In some examples, control information transmitted in a physical control channel may be distributed between different control regions in a cascaded manner (e.g., between a common control region or common search space and one or more UE-specific control regions or UE-specific search spaces).

A carrier may be associated with a particular bandwidth of the radio frequency spectrum, and in some examples the carrier bandwidth may be referred to as a "system bandwidth" of the carrier or the wireless communications system 100. For example, the carrier bandwidth may be one of a number of predetermined bandwidths for carriers of a particular radio access technology (e.g., 1.4, 3, 5, 10, 15, 20, 40, or 80 MHz). In some examples, each served UE 115 may be configured for operating over portions or all of the carrier bandwidth. In other examples, some UEs 115 may be configured for operation using a narrowband protocol type that is associated with a predefined portion or range (e.g., set of subcarriers or RBs) within a carrier (e.g., "in-band" deployment of a narrowband protocol type).

In a system employing MCM techniques, a resource element may consist of one symbol period (e.g., a duration of one modulation symbol) and one subcarrier, where the symbol period and subcarrier spacing are inversely related. The number of bits carried by each resource element may depend on the modulation scheme (e.g., the order of the modulation scheme). Thus, the more resource elements that a UE 115 receives and the higher the order of the modulation scheme, the higher the data rate may be for the UE 115. In MIMO systems, a wireless communications resource may refer to a combination of a radio frequency spectrum resource, a time resource, and a spatial resource (e.g., spatial layers), and the use of multiple spatial layers may further increase the data rate for communications with a UE 115.

Devices of the wireless communications system 100 (e.g., base stations 105 or UEs 115) may have a hardware configuration that supports communications over a particular carrier bandwidth, or may be configurable to support communications over one of a set of carrier bandwidths. In some examples, the wireless communications system 100 may include base stations 105 and/or UEs that can support simultaneous communications via carriers associated with more than one different carrier bandwidth.

Wireless communications system 100 may support communication with a UE 115 on multiple cells or carriers, a feature which may be referred to as carrier aggregation (CA) or multi-carrier operation. A UE 115 may be configured with multiple downlink CCs and one or more uplink CCs according to a carrier aggregation configuration. Carrier aggregation may be used with both FDD and TDD component carriers.

In some cases, wireless communications system 100 may utilize enhanced component carriers (eCCs). An eCC may be characterized by one or more features including wider carrier or frequency channel bandwidth, shorter symbol duration, shorter TTI duration, or modified control channel configuration. In some cases, an eCC may be associated with a carrier aggregation configuration or a dual connectivity configuration (e.g., when multiple serving cells have a suboptimal or non-ideal backhaul link). An eCC may also be configured for use in unlicensed spectrum or shared spectrum (e.g., where more than one operator is allowed to use the spectrum). An eCC characterized by wide carrier bandwidth may include one or more segments that may be utilized by UEs 115 that are not capable of monitoring the whole carrier bandwidth or are otherwise configured to use a limited carrier bandwidth (e.g., to conserve power).

In some cases, an eCC may utilize a different symbol duration than other CCs, which may include use of a reduced symbol duration as compared with symbol durations of the other CCs. A shorter symbol duration may be associated with increased spacing between adjacent subcarriers. A device, such as a UE 115 or base station 105, utilizing eCCs may transmit wideband signals (e.g., according to frequency channel or carrier bandwidths of 20, 40, 60, 80 MHz, etc.) at reduced symbol durations (e.g., 16.67 microseconds). A TTI in eCC may consist of one or multiple symbol periods. In some cases, the TTI duration (that is, the number of symbol periods in a TTI) may be variable.

Wireless communications systems such as an NR system may utilize any combination of licensed, shared, and unlicensed spectrum bands, among others. The flexibility of eCC symbol duration and subcarrier spacing may allow for the use of eCC across multiple spectrums. In some examples, NR shared spectrum may increase spectrum utilization and spectral efficiency, specifically through dynamic vertical (e.g., across frequency) and horizontal (e.g., across time) sharing of resources.

A device such as a base station 105 or a UE 115 may transmit or receive a codeword that was encoded using a polar code. For example, a transmitting device may identify a set of payload bits and determine a set of error-detecting check bits (e.g., CRC bits) based on the set of payload bits. Some of the payload bits and the error-detecting check bits (e.g., which may collectively be referred to as information bits) may be interleaved or interlaced with each other to form an input vector to be encoded. The interleaved bits may be interleaved according to an interleaving pattern, which may be based on an error check function used to generate the error-detecting check bits. For instance, the error check function may have an associated bit shift property that may be used for determining one or more locations for interleaving error-detecting check bits with the payload bits. In some cases, only a portion of the total amount of payload bits may be interleaved. Further, only a portion of the total amount of error-detecting check bits may be interleaved. Alternatively, the error-detecting check bits may be concatenated with the payload bits to form the input vector. In either case, the input vector may be encoding using a polar coding process to obtain a codeword for transmission to a receiving device. In accordance with aspects of the present disclosure, the encoding operation may include application of a recipient-specific masking operation to the most reliable bit channels of the polar coding process.

The receiving device, which may be a UE 115 or a base station 105, may receive the codeword encoded using the polar code and perform a polar decoding process on the codeword. During the polar decoding process, the device may determine to terminate the process prior to completion. For example, based on the interleaving pattern used to interleave payload bits and error-detecting check bits of the codeword, the receiving device may be able to determine and perform error checking using a set of decoded bits prior to decoding the entire codeword. Additionally or alternatively, the receiving device may apply a masking operation to determine whether the codeword is intended for the receiving device. By applying the masking operation to the most reliable set of bit positions, the receiving device may improve the accuracy of a classifying operation through which the codeword is determined to be valid or invalid. This improved accuracy may reduce communication latency, decrease power consumption at the receiving device, or provide other such benefits.

Figure 2:
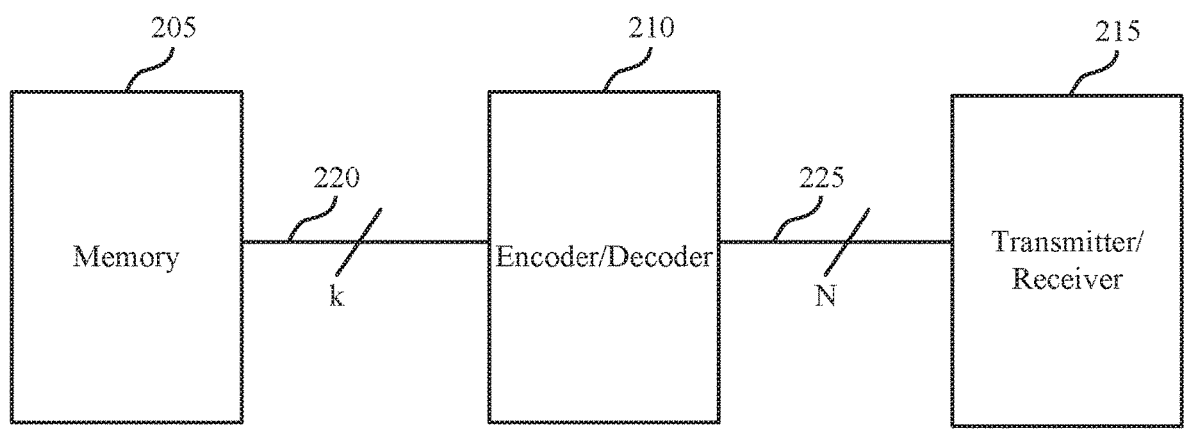
FIG. 2 illustrates an example of a device that supports user-specific scrambling for polar codes in accordance with aspects of the present disclosure.

FIG. 2 illustrates an example of a device 200 that supports user-specific scrambling for polar codes in accordance with various aspects of the present disclosure. In some examples, the device 200 may implement aspects of wireless communication system 100. The device 200 may be any device within a wireless communications system 100 that performs an encoding or decoding process (e.g., using an error-correcting code). For example, the device 200 may be a UE 115 or base station 105 as described with reference to FIG. 1.

As shown, device 200 includes a memory 205, an encoder/decoder 210, and a transmitter/receiver 215. First bus 220 may connect memory 205 to encoder/decoder 210 and second bus 225 may connect encoder/decoder 210 to transmitter/receiver 215. In some instances, device 200 may have data stored in memory 205 to be transmitted to another device, such as a UE 115 or base station 105. To initiate the transmission process, device 200 may retrieve from memory 205 the data for transmission. The data may include a number of payload bits, which may be '1's or '0's, provided from memory 205 to encoder/decoder 210 via first bus 220. The number of payload bits may be represented as a value 'k,' as shown.

The encoder/decoder 210 may encode the number of payload bits and output a codeword having a length 'N,' which may be different from or the same as k. The bits that are not allocated as payload bits (i.e., N–k bits) may be assigned as frozen bits or parity bits (e.g., error-detecting check bits). In some cases, the information bits (e.g., the payload bits and the error-detecting check bits) may be assigned to the most reliable bit channels, and the frozen bits may be assigned to the remaining bit channels. Frozen bits may be bits of a default value (e.g., '0' or '1') known to both the encoder and decoder (i.e., the encoder encoding information bits at a transmitter and the decoder decoding the codeword received at a receiver). The transmitter/receiver 215 may transmit 'M' bits, which may be the same as 'N,' or may be smaller or larger than 'N' as a result of puncturing or repetition of the 'N' bits of the codeword.

From the receiving device perspective, device 200 may receive encoded data via receiver 215, and decode the encoded data using decoder 210 to obtain the transmitted data. In some wireless systems, decoder 210 may be an example of an SCL decoder. A UE 115 or base station 105 may receive a transmission including a codeword at receiver 215 and may send the transmission to the SCL decoder (e.g., decoder 210). The SCL decoder may determine input logarithmic-likelihood ratios (LLRs) for the bit channels of the received codeword. During decoding, the SCL decoder may determine decoded LLRs based on these input LLRs, where the decoded LLRs correspond to each bit channel of the polar code. These decoded LLRs may be referred to as bit metrics. In some cases, if the LLR is zero or a positive value, the SCL decoder may determine the corresponding bit is a '0.' Alternatively, a negative LLR may correspond to a '1.' The SCL decoder may use the bit metrics to determine the decoded bit values.

The SCL decoder may employ multiple concurrent successive cancellation (SC) decoding processes. Each SC decoding process may decode the codeword sequentially (e.g., in order of the bit channel indices). Due to the combination of multiple SC decoding processes, the SCL decoder may calculate multiple decoding path candidates. For example, an SCL decoder of list size 'L' (i.e., the SCL decoder has L SC decoding processes) may calculate L decoding path candidates, and a corresponding reliability metric (e.g., a path metric) for each decoding path candidate. The path metric may represent a reliability of a decoding path candidate or a probability that the corresponding decoding path candidate is the correct set of decoded bits. The path metric may be based on the determined bit metrics and the bit values selected at each bit channel. The SCL decoder may have a number of levels equal to the number of bit channels in the received codeword. At each level, each decoding path candidate may select either a 0 bit or a 1 bit based on a path metric of the 0 bit and the 1 bit. The SCL decoder may select a decoding path candidate based on the path metrics, and may output the bits corresponding to the selected decoding path as the decoded sets of bits. For example, the SCL decoder may select the decoding paths with the highest (or least-negative) path metrics.

In some cases, decoder 210 may decode the signal received by receiver 215 to obtain a set of information bits. Decoder 210 may perform a CRC or parity check operation on a data payload within the set of information bits, and may determine that the data payload represents a successfully decoded codeword intended for device 200. In some cases, the decoding operation may fail because the codeword has experienced excessive corruption (e.g., the channel has very low signal to noise ratio (SNR)), because there is no transmitted codeword for the candidate hypothesis (e.g., the codeword represents random noise), because the transmitted codeword is intended for a different device, or because the candidate hypothesis is incorrect (e.g., incorrect codeword size, incorrect information bit size, incorrect aggregation level). In these cases, decoder 210 may detect a decoding failure and attempt decoding using a different candidate codeword. Early detection and termination (e.g., detection and termination prior to completion of SCL decoding) may reduce latency and conserve energy at device 200.

In some examples, decoder 210 may determine decoding failure early if the signal received by the receiver 215 includes a set of payload bits interleaved with a set of error-detecting check bits (e.g., CRC bits). For instance, the interleaved bits may include a portion of error-detecting check bits interleaved with a portion of payload bits from which the portion of error-detecting check bits depend. Thus, the error-detecting check bits may be partially distributed within the codeword such that only a portion of error-detecting check bits are interleaved with payload bits.

Further, the error-detecting check bits may be generated based on an error check function (e.g., a CRC polynomial) that has a bit shift property. For example, the CRC polynomial may have sections that include shift operations between feedback (or feed-forward) input (e.g., XOR operations).

The bit shift property may be that some CRC bits for a given clock cycle are shifted bits from a previous clock cycle. Based on the bit shift property, the error-detecting check bits may be interleaved to facilitate early termination. In some examples, a group of error-detecting check bits selected as a contiguous block having the bit shift property may be interleaved using an error check bit interleaving pattern (e.g., inserted as a block, interlaced in a one-to-one or two-by-two pattern, etc.) within the payload bits and may be located at a starting location corresponding to the location of a starting point of the bit shift property (e.g., a location within the CRC polynomial where a section of shift operations without XOR operations starts). In such instances, a receiving device may decode the codeword and perform an error-detecting check process using the block of error check bits prior to decoding the remaining information bits. Based on a result of the error-detecting check process, the decoder (or receiving device) may determine to terminate decoding prior to completion. Such interleaving techniques may contribute to suppression of false alarm rates. However, benefits of the described techniques are not restricted to codewords that are generated based on such an interleaving pattern. That is, the suppression of false alarm rates may be achieved independently of and provide benefits separate from those realized based on an interleaved codeword, as discussed further below.

Figure 3:
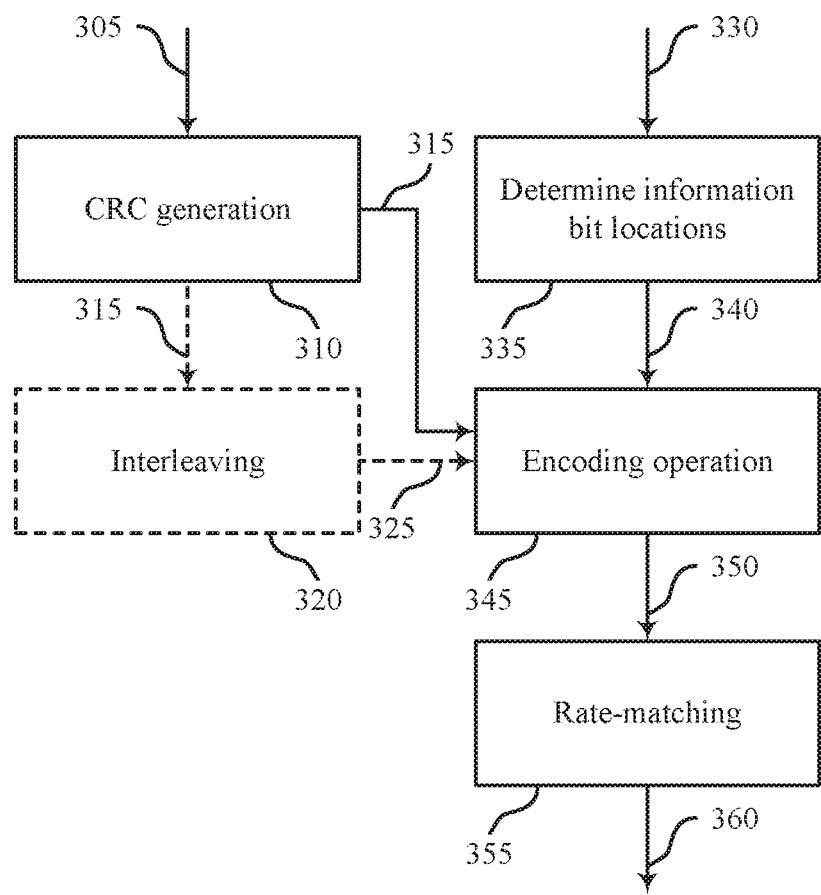
FIG. 3 illustrates an example of a process flow that supports user-specific scrambling for polar codes in accordance with aspects of the present disclosure.

FIG. 3 illustrates an example of a process flow 300 that supports user-specific scrambling for polar codes in accordance with various aspects of the present disclosure. In some examples, process flow 300 may implement aspects of wireless communication system 100. For example, process flow 300 may be implemented at a transmitting wireless device such as a base station 105 or a UE 115, each of which may be an example of a device 200 as described with reference to FIG. 2. Process flow 300 is described in the context of an encoding device. It is to be understood that complementary (e.g., but opposite) techniques to those described with reference to process flow 300 may be performed at a decoding device (e.g., as described with reference to FIG. 7).

At 310, CRC generation may be performed for a set of payload bits 305. For example, the set of payload bits 305 may be retrieved from memory as described with reference to FIG. 2 or may be otherwise obtained to be prepared for transmission. By way of example, the set of payload bits may include 'k' bits as described with reference to FIG. 2. The CRC generation at 310 (e.g., which may be based on application of a CRC polynomial to the set of payload bits 305) may generate a set of CRC bits (e.g., which may alternatively be referred to as error-check bits or error-detecting check bits). In the present example, the set of CRC bits may include 'A' bits, and these bits may be concatenated to the set of payload bits 305 to form an input vector 315. In some cases, the input vector may optionally undergo interleaving at 320 whereby the set of payload bits 305 (or a portion thereof) is interlaced with the set of CRC bits (e.g., or a portion thereof) to produce an interleaved input vector 325. The interleaved input vector 325 may be fed to an encoding operation 345. Alternatively, the input vector 315 may be directly fed to the encoding operation 345 (e.g., without undergoing interleaving at 320). For example, interleaving may be disabled for downlink control information (DCI) transmissions.

The transmitting device may obtain a set of bit indices 330 ordered in ascending reliability order. For example, the set of bit indices 330 may include 'N' bit indices (where N is the length of the codeword to be transmitted as described with reference to FIG. 2). At 335, the transmitting device may determine information bit locations 340 of the set of bit indices 330. For example, the information bit locations 340 may be based on a decoding order of the bit indices, a reliability order of the bit indices, or a combination thereof. The information bit locations 340 may be fed to the encoding operation at 345 ordered in ascending reliability order (e.g., instead of being ordered based exclusively on a decoding order). The encoding operation at 345 may be a polar encoding operation. For example, the transmitting device may initialize a length N zero-vector and fill the information bit locations 340 with respective bits of the input vector 315 (e.g., or the interleaved input vector 325) and perform a polar transformation. The output 350 of the encoding operation may undergo rate-matching at 355 to produce a codeword 360 for transmission. Rate matching may involve selecting some of the coded bits of the output 350 for transmission in a particular TI. For example, the rate matching at 355 may puncture some of the N bits of the output 350 and produce M of the N bits, where M is a positive integer that is less than N. In some cases, the rate matching at 355 may repeat one or more bits of the N bits of the polar-encoded codeword to generate M bits for transmission, where M is greater than N. The rate matching at 355 may output a rate-matched polar-encoded codeword 360 for modulation and transmission (e.g., by transmitter/receiver 215 as described with reference to FIG. 2).

Figure 4A:
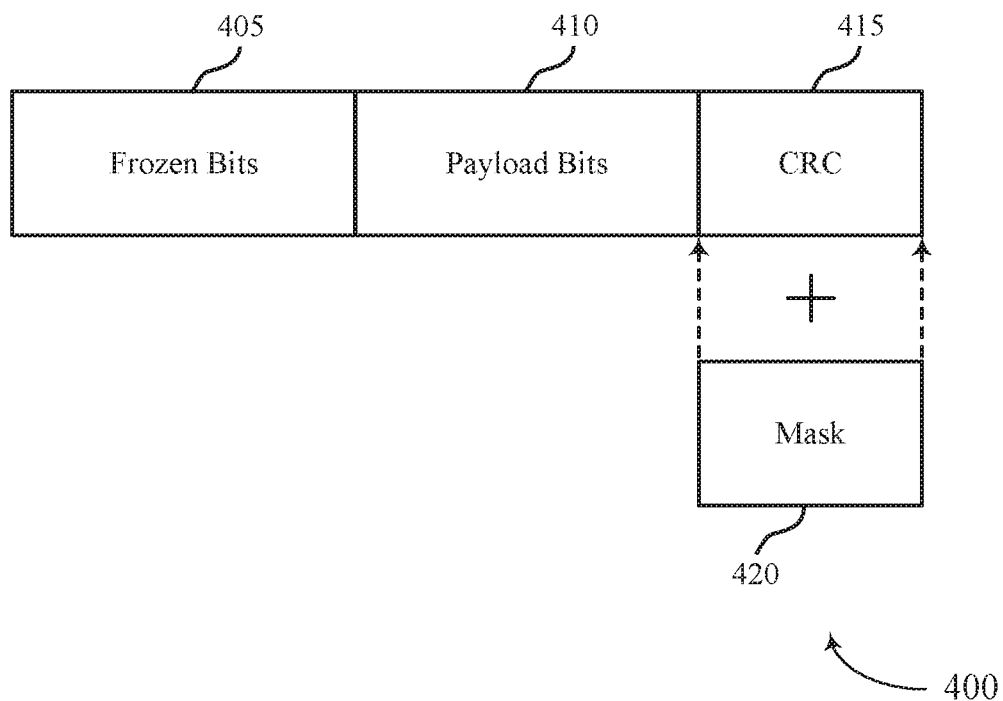
FIGS. 4A and 4B illustrate example masking operations, aspects of which support user-specific scrambling for polar codes in accordance with aspects of the present disclosure.

FIG. 4A illustrates an example of a masking operation 400. In some examples, masking operation 400 may implement aspects of wireless communication system 100. For example, masking operation 400 may be performed at a transmitting device or a receiving device, each of which may be an example of a device 200 as described with reference to FIG. 2.

Masking operation 400 includes a set of frozen bits 405, a set of payload bits 410, and a set of CRC bits 415 (e.g., which may alternatively be referred to as a set of error-detecting check bits). In aspects of the present disclosure, the set of payload bits 410 and the set of CRC bits 415 may be cumulatively referred to as a set of information bits. As illustrated, in some cases a mask 420 may be applied to the set of CRC bits 415. For example, applying the mask 420 may include applying a bit-wise XOR operation between the set of CRC bits 415 (or a subset of the set of CRC bits 415) and an identifier of an intended recipient of a codeword generated from the set of information bits. For example, the identifier may be or include a RNTI of the intended recipient or some other identifier which provides orthogonality for potential recipients of the transmission. By way of example, the mask 420 may directly flip the set of CRC bits 415 (e.g., may convert a '0' to a '1' and may convert a '1' to a '0' if a given bit of the mask 420 is a '1') or may involve more sophisticated logic. In some cases, masking operation 400 may produce a relatively high false alarm rate at a receiving device (e.g., because the mask 420 is applied to the set of CRC bits 415, which may be mapped to bit locations of the polar encoding operation based on a decoding order of the bit locations). That is, except for any bits that are affected by distributed-CRC interleaving, most of the mask 420 bits are used to scramble the last decoded bits in the u-domain of the polar code.

Figure 4B:
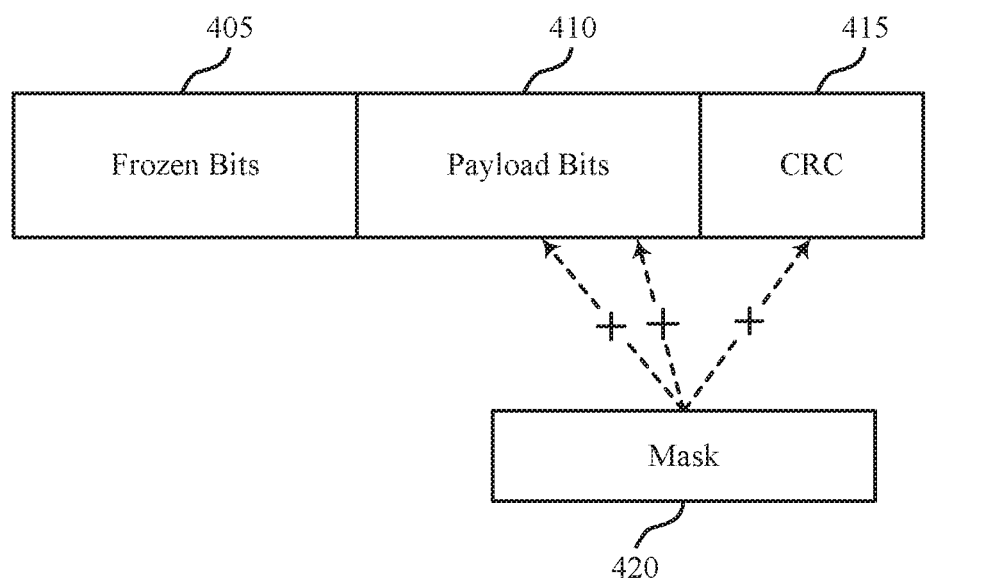

FIG. 4B illustrates an example of a masking operation 450, which may support user-specific scrambling for polar codes in accordance with various aspects of the present disclosure. In some examples, masking operation 450 may implement aspects of wireless communication system 100. For example, masking operation 450 may be performed at a transmitting device or a receiving device, each of which may be an example of a device 200 as described with reference to FIG. 2.

Like masking operation 400, masking operation 450 includes a set of frozen bits 405, a set of payload bits 410, and a set of CRC bits 415. As illustrated, in some cases the mask 420 may be applied to a set of information bits which includes at least one bit of the set of payload bits 410 and at least one bit of the set of CRC bits 415. For example, applying the mask 420 may include applying a bit-wise XOR operation between the information bits which are mapped to a most reliable subset of the set of bit channels of the polar encoding operation and an identifier of an intended recipient of a codeword generated from the set of information bits. For example, the identifier may include a RNTI or some other identifier which provides orthogonality for potential recipients of the transmission. By way of example, the mask 420 may directly flip the set of information bits mapped to the most reliable bit channels (e.g., may convert a '0' to a '1' and may convert a '1' to a '0' if a given bit of the mask 420 is a '1') or may involve more sophisticated logic. In some cases, masking operation 400 may suppress a false alarm rate at a receiving device (e.g., because the mask 420 is applied to a subset of the set of information bits which is mapped to bit locations of the polar encoding operation based on a reliability order of the bit locations).

Masking operation 450 may mitigate a false alarm problem, even when the target receiving device and an unintended recipient device have identifier binary sequences that are very similar (e.g., that differ only at one bit position). Further, because masking operation 450 does not alter the payload of the codeword (e.g., only modifies the scrambling of the codeword), the block error rate (BLER) of the communications may compare favorably (e.g., or be the same as) the BLER associated with masking operation 400. Lastly, masking operation 450 may not result in any additional computation (e.g., which may consume processing resources) because the reliability order may already have been determined based on the polar code construction sequence.

Figure 5:
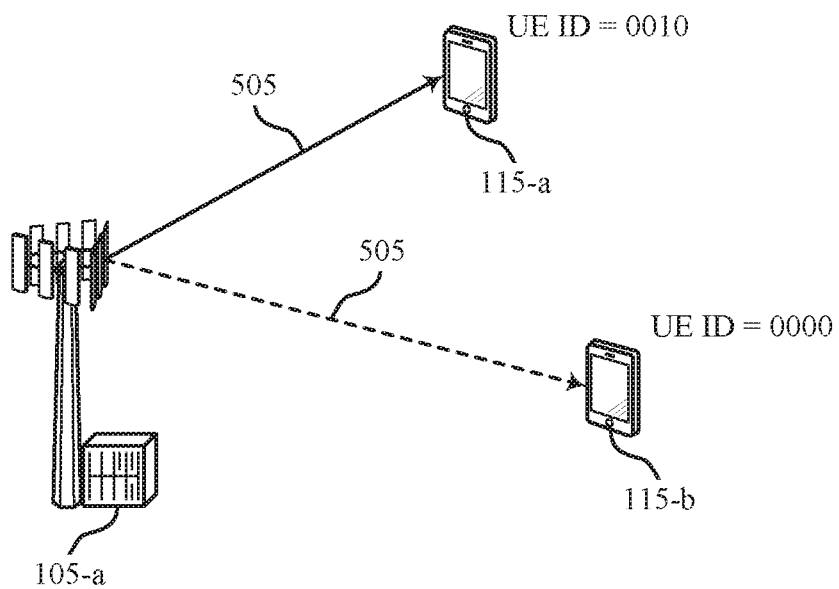
FIG. 5 illustrates an example of a wireless communications system that supports user-specific scrambling for polar codes in accordance with aspects of the present disclosure.

FIG. 5 illustrates an example of a wireless communications system 500 that supports user-specific scrambling for polar codes in accordance with various aspects of the present disclosure. In some examples, wireless communications system 500 may implement aspects of wireless communication system 100. For example, wireless communications system includes base station 105-a, UE 115-a, and UE 115-b, each of which may be an example of the corresponding devices described with reference to FIG. 1 and/or a device 200 as described with reference to FIG. 2

Base station 105-a may transmit a codeword 505 with UE 115-a as the intended recipient (illustrated by solid line 505). However, because the codeword 505 may be multiplexed over wireless resources of a multiple-access system, UE 115-b may additionally receive codeword 505 (illustrated by dashed line 505). In the present example, codeword 505 may comprise all '0' payload bits. This example is used for simplicity of explanation and is not limiting of scope. Additionally, aspects of the present example are described assuming that UE 115-a and UE 115-b each use an SCL decoder with a list-size of eight (8), though other list-sizes may be used (e.g., such that each UE 115 may use a different list-size). In some cases, the list-size may be a power of two (2).

As illustrated by wireless communications system 500, UE 115-a may have a UE identifier (UE ID) of '0010' while UE 115-b may have a UE ID (e.g., a RNTI) of '0000.' That is, the respective UE IDs may differ only at one bit position. Using techniques described with reference to FIG. 2, each UE 115 may obtain multiple decoding candidates 525, each with an associated path metric 530. With reference to UE 115-a, first decoding path 510 may produce a highest path metric 530 and may be associated with a proper decoding operation. That is, first decoding path 510 may contain the correct set of payload bits (e.g., all '0' bits) and may pass CRC (e.g., because the error-detecting check bits of first decoding path 510 match the UE ID of UE 115-a). Thus, UE 115-a may properly classify first decoding path 510 as valid.

Similarly, UE 115-b may obtain a plurality of decoding candidates 525, each with an associated path metric 530. For ease of explanation, the decoding candidates 525 are described as being common to UE 115-a and UE 115-b, though it is to be understood that in some cases each UE 115 may obtain a different set of decoding candidates 525 based on different channel conditions between the respective UE 115 and base station 105. Because none of first decoding path 510 or subsequent decoding paths 515 pass CRC for the UE ID of UE 115-b, UE 115-b may properly rule these decoding paths as invalid. However, final decoding path 520 (e.g., which is associated with a lowest path metric 530 of the decoding candidates produced by the SCL decoder) may improperly pass CRC for UE 115-b. Though described as having the lowest path metric 530, the decoding candidate 525 which improperly passes CRC may occur at any point within the list of decoding candidates 525.

By applying a masking operation to the most reliable set of bit locations (e.g., as described with reference to FIG. 4B), the path metric 530 of any decoding candidates 525 which contain an inaccurate set of error-detecting check bits may be reduced, such that these decoding candidates fall out of the SCL decoding operation (e.g., do not have a path metric 530 which lands in the top eight of the SCL decoding operation in the present example). Thus, the described techniques may reduce the false alarm rate of the decoding operation, which may support early termination (e.g., in the case that CRC is performed before the decoding operation is completed) or may stop an unintended device such as UE 115-b from monitoring for a subsequent transmission, which may be improperly combined with the incorrectly decoded codeword and may increase BLER or otherwise negatively impact communications.

FIG. 6 illustrates an example of a reliability sequence 600 for a polar code that supports user-specific scrambling for polar codes in accordance with various aspects of the present disclosure. Reliability sequence 600 may illustrate, for example, bit-channel reliability for a polar code where N=256, k=64, and M=216. Reliability sequence 600 may be generated by any suitable reliability ordering technique (e.g., polarization weight, density evolution, mutual-information density evolution, etc.). The numbering may show ascending bit channel reliability of the 64 bit channels for mapping of an input vector to the polar code. For example, bit-channel 122 of the 256 bit-channels of the polar code may be the lowest reliability bit channel of the 64 bit-channels used for information bits, while bit-channel 255 is the highest reliability bit channel of the 64 bit-channels used for information bits.

Decoding order bit mask 605 shows those bit channels that are masked for a 16-bit mask that is applied in a decoding order of the polar code. That is, where a bit mask is applied according to a decoding order, the 64 selected bit-channels for information bits may effectively be re-ordered according to the decoding order, with the bit-mask applied to those bits at the end of the decoding order (with the CRC concatenated to the payload). In some examples, the CRC bits may be the same as the masked bits for decoding order bit mask 605.

Reliability order bit mask 610 shows those bit channels that are masked for a 16-bit mask that is applied in a reliability order of the polar code. As shown by reliability order bit mask 610, the highest reliability bit channels may be selected for masking. In some examples, the bit-channels in reliability order bit mask 610 may include at least some payload bits. For example, where a 16-bit CRC is mapped to bit-channels in a decoding order, bit-channels 127, 191, 223, 238, and 239 will be payload bits that are masked with bits of the 16-bit mask, while bit channels 240, 241, 242, 244, and 248 will be CRC bits that are not masked.

Figure 7:
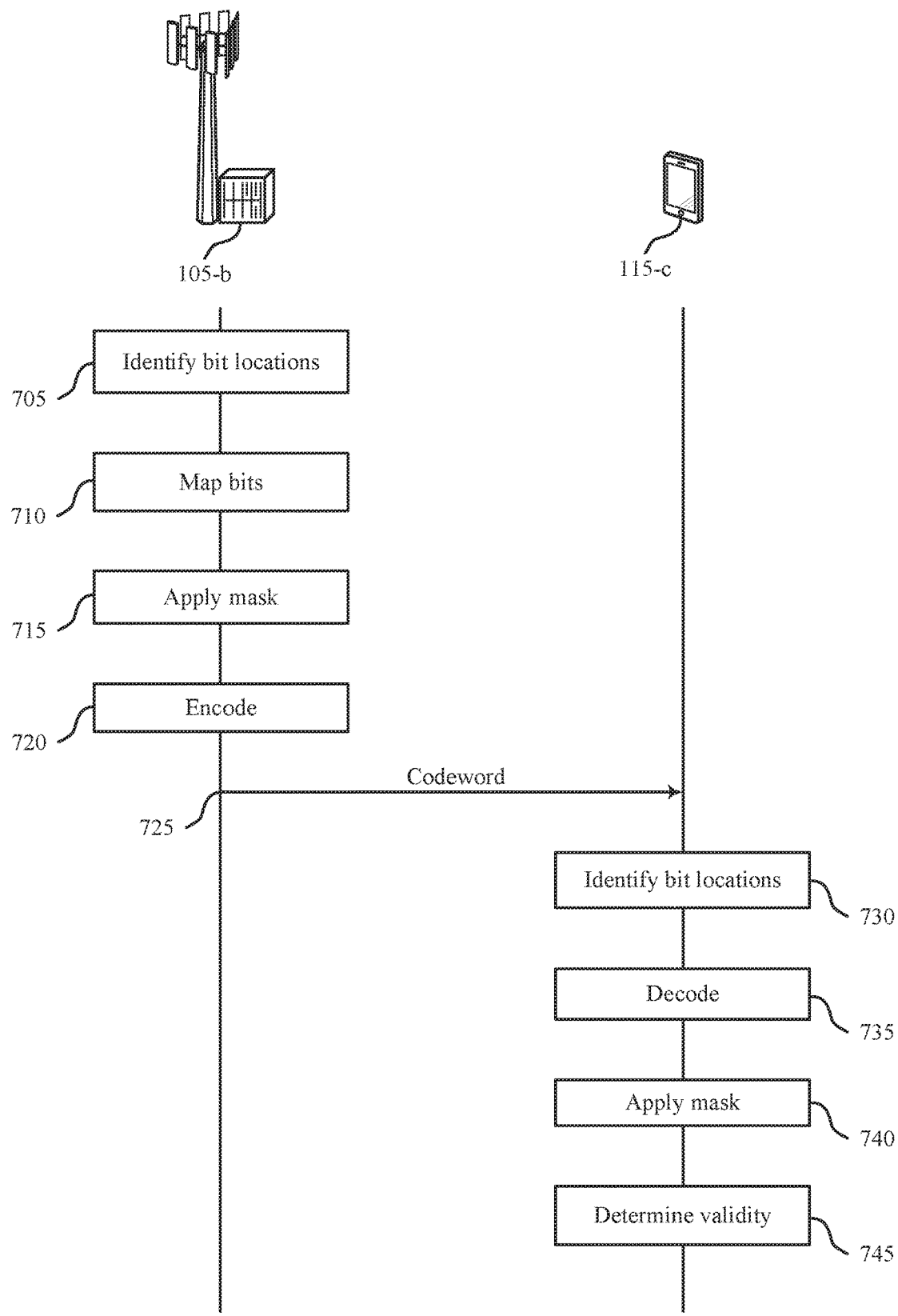
FIG. 7 illustrates an example of a process flow that supports user-specific scrambling for polar codes in accordance with aspects of the present disclosure.

FIG. 7 illustrates an example of a process flow 700 that supports user-specific scrambling for polar codes in accordance with various aspects of the present disclosure. In some examples, process flow 700 may implement aspects of wireless communication system 100. For example, process flow 700 includes base station 105-*b* and UE 115-*c*, each of which may be an example of the corresponding devices described with reference to FIG. 1.

At 705, base station 105-*b* may identify a set of bit locations of a polar code for encoding an input vector based at least in part on a reliability order of the bit locations. For example, base station 105-*b* may identify the most reliable bit locations (e.g., or the most reliable bit locations which satisfy a given decoding order threshold) based on an amount of data to be transmitted, based on current channel conditions, based on a type of data to be transmitted, etc. In aspects of the present disclosure, the input vector includes a set of payload bits and a set of error-detecting check bits (e.g., CRC bits). In some cases, the most reliable bit locations may be determined based on reference to a lookup table.

At 710, base station 105-*b* may map bits of the input vector to respective bit locations of the identified set of bit locations. As described with reference to FIG. 3, the input vector may include payload bits interleaved with error-detecting check bits or may simply comprise error-detecting check bits concatenated to the payload bits. Each bit of the input vector may be mapped to a respective bit location of the identified set of bit locations.

At 715, base station 105-*b* may apply a masking operation to a subset of bits of the input vector that is mapped to a most reliable subset of the identified set of bit locations. In some examples, the subset of bits of the input vector includes at least one payload bit and at least one error-detecting check bit. For example, the masking operation may be performed as described with reference to FIG. 4B. The masking operation may be based at least in part on an identifier of UE 115-*c* (e.g., or another UE 115) such as a RNTI and may include performing an XOR operation between bit positions of the RNTI and the subset of bits of the input vector.

At 720, base station 105-*b* may perform an encoding operation according to the mapped input vector to generate a codeword for transmission. For example, the encoding operation may be performed as described with reference to FIGS. 2 and 3 and may in some cases include rate-matching the output of the encoding operation to generate the codeword.

At 725, base station 105-*b* may transmit (and UE 115-*c* may receive) the codeword. In some cases, more than one UE 115 may receive the codeword (e.g., as described with reference to FIG. 5).

At 730, UE 115-*c* may identify a set of bit locations of a polar code for decoding the codeword based at least in part on a reliability order of the bit locations. The operations performed by UE 115-*c* at 730 may be analogous to those performed by base station 105-*b* at 605.

At 735, UE 115-*c* may apply a decoding operation to the codeword to generate a decoding candidate (e.g., or a plurality of decoding candidates in the case of an SCL decoder), where each decoding candidate includes a representation of the input vector (e.g., a theorized set of bits corresponding to a hypothesis for the input vector used to generate the codeword).

At 740, UE 115-*c* may apply a masking operation for each decoding candidate of the decoding candidates generated at 635. For example, the operations of UE 115-*c* at 740 may complement those performed by base station 105-*b* at 715. That is, the masking operation at 740 may be applied to a subset of bits of each representation of the input vector, where the subset of bits is mapped to a most reliable subset of the set of bit locations identified at 730.

At 745, UE 115-*c* may determine a validity of each decoding candidate based at least in part on a result of the masking operation(s) performed at 740. Using techniques described herein, the false alarm rate of the operations at 745 may be suppressed.

Figure 8:
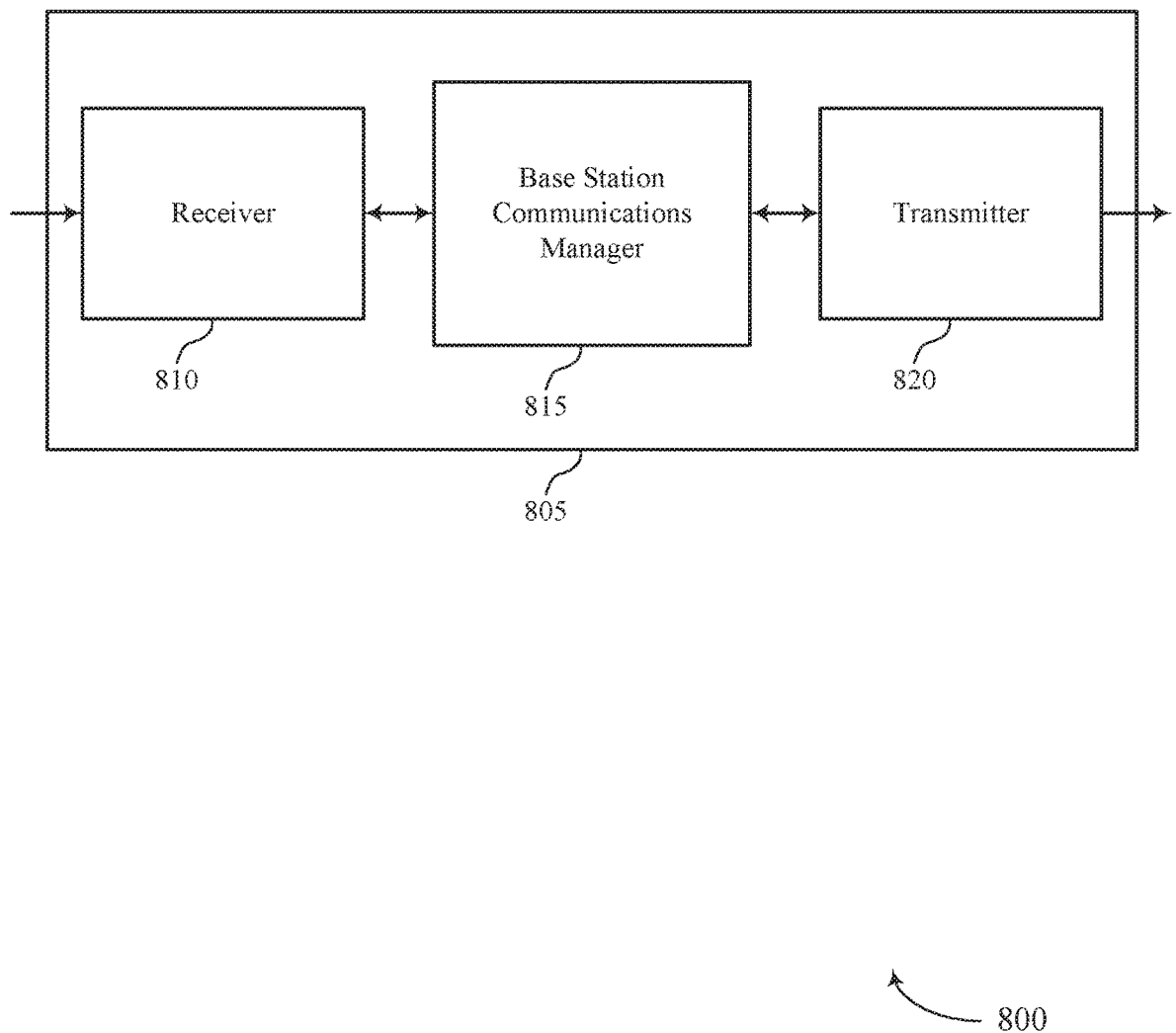
FIGS. 8 and 9 show block diagrams of a wireless device that supports user-specific scrambling for polar codes in accordance with aspects of the present disclosure.

FIG. 8 shows a block diagram 800 of a wireless device 805 that supports user-specific scrambling for polar codes in accordance with aspects of the present disclosure. Wireless device 805 may be an example of aspects of a base station 105 as described herein. Wireless device 805 may include receiver 810, base station communications manager 815, and transmitter 820. Wireless device 805 may also include a processor. Each of these components may be in communication with one another (e.g., via one or more buses).

Receiver 810 may receive information such as packets, user data, or control information associated with various information channels (e.g., control channels, data channels, and information related to user-specific scrambling for polar codes, etc.). Information may be passed on to other components of the device. The receiver 810 may be an example of aspects of the transceiver 1035 described with reference to FIG. 10. The receiver 810 may utilize a single antenna or a set of antennas.

Base station communications manager 815 may be an example of aspects of the base station communications manager 1015 described with reference to FIG. 10. Base station communications manager 815 and/or at least some of its various sub-components may be implemented in hardware, software executed by a processor, firmware, or any combination thereof. If implemented in software executed by a processor, the functions of the base station communications manager 815 and/or at least some of its various sub-components may be executed by a general-purpose processor, a digital signal processor (DSP), an application-specific integrated circuit (ASIC), an field-programmable gate array (FPGA) or other programmable logic device, discrete gate or transistor logic, discrete hardware components, or any combination thereof designed to perform the functions described in the present disclosure.

The base station communications manager 815 and/or at least some of its various sub-components may be physically located at various positions, including being distributed such that portions of functions are implemented at different physical locations by one or more physical devices. In some examples, base station communications manager 815 and/or at least some of its various sub-components may be a separate and distinct component in accordance with various aspects of the present disclosure. In other examples, base station communications manager 815 and/or at least some of its various sub-components may be combined with one or more other hardware components, including but not limited to an I/O component, a transceiver, a network server, another computing device, one or more other components described in the present disclosure, or a combination thereof in accordance with various aspects of the present disclosure.

Base station communications manager 815 may identify a set of bit locations of a polar code for encoding an input vector based on a reliability order of the bit locations, where the input vector includes a set of payload bits and a set of error detecting check bits. Base station communications manager 815 may map bits of the input vector to respective bit locations of the set of the bit locations. Base station communications manager 815 may apply a masking operation to a subset of bits of the input vector that is mapped to a most reliable subset of the set of the bit locations, where the subset of bits of the input vector includes at least one bit of the set of payload bits. Base station communications manager 815 may perform an encoding operation according to the mapped input vector to generate a codeword, and transmit the codeword to a second wireless device.

Transmitter 820 may transmit signals generated by other components of the device. In some examples, the transmitter 820 may be collocated with a receiver 810 in a transceiver module. For example, the transmitter 820 may be an example of aspects of the transceiver 1035 described with reference to FIG. 10. The transmitter 820 may utilize a single antenna or a set of antennas.

Figure 9:
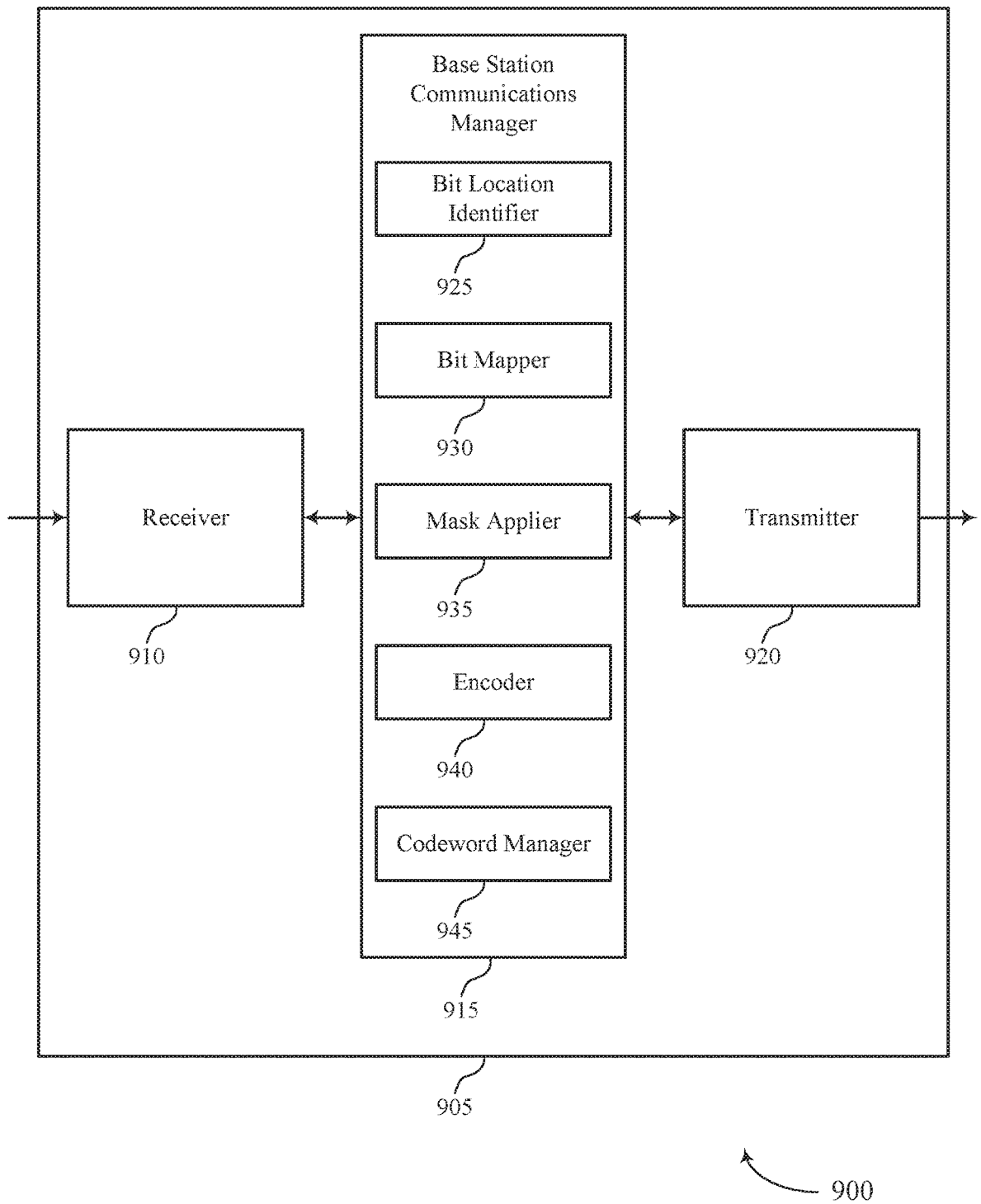

FIG. 9 shows a block diagram 900 of a wireless device 905 that supports user-specific scrambling for polar codes in accordance with aspects of the present disclosure. Wireless device 905 may be an example of aspects of a wireless device 805 or a base station 105 as described with reference to FIG. 8. Wireless device 905 may include receiver 910, base station communications manager 915, and transmitter 920. Wireless device 905 may also include a processor. Each of these components may be in communication with one another (e.g., via one or more buses).

Receiver 910 may receive information such as packets, user data, or control information associated with various information channels (e.g., control channels, data channels, and information related to user-specific scrambling for polar codes, etc.). Information may be passed on to other components of the device. The receiver 910 may be an example of aspects of the transceiver 1035 described with reference to FIG. 10. The receiver 910 may utilize a single antenna or a set of antennas. Base station communications manager 915 may be an example of aspects of the base station communications manager 1015 described with reference to FIG. 10. Base station communications manager 915 may also include bit location identifier 925, bit mapper 930, mask applier 935, encoder 940, and codeword manager 945.

Bit location identifier 925 may identify a set of bit locations of a polar code for encoding an input vector based on a reliability order of the bit locations, where the input vector includes a set of payload bits and a set of error detecting check bits.

Bit mapper 930 may map bits of the input vector to respective bit locations of the set of the bit locations. In some cases, the mapping includes mapping the bits of the input vector to the respective bit locations of the set of the bit locations based on a decoding order of the set of the bit locations.

Mask applier 935 may apply a masking operation to a subset of bits of the input vector that is mapped to a most reliable subset of the set of the bit locations, where the subset of bits of the input vector includes at least one bit of the set of payload bits. In some cases, a kernel of the masking operation is based on an identifier of the second wireless device. In some cases, the masking operation includes an XOR operation between each bit of the kernel and a corresponding bit of the subset of bits of the input vector. In some cases, the identifier of the second wireless device includes a RNTI.

Encoder 940 may perform an encoding operation according to the mapped input vector to generate a codeword. Codeword manager 945 may transmit the codeword to a second wireless device. Transmitter 920 may transmit signals generated by other components of the device (e.g., codeword manager 845). In some examples, the transmitter 920 may be collocated with a receiver 910 in a transceiver module. For example, the transmitter 920 may be an example of aspects of the transceiver 1035 described with reference to FIG. 10. The transmitter 920 may utilize a single antenna or a set of antennas.

Figure 10:
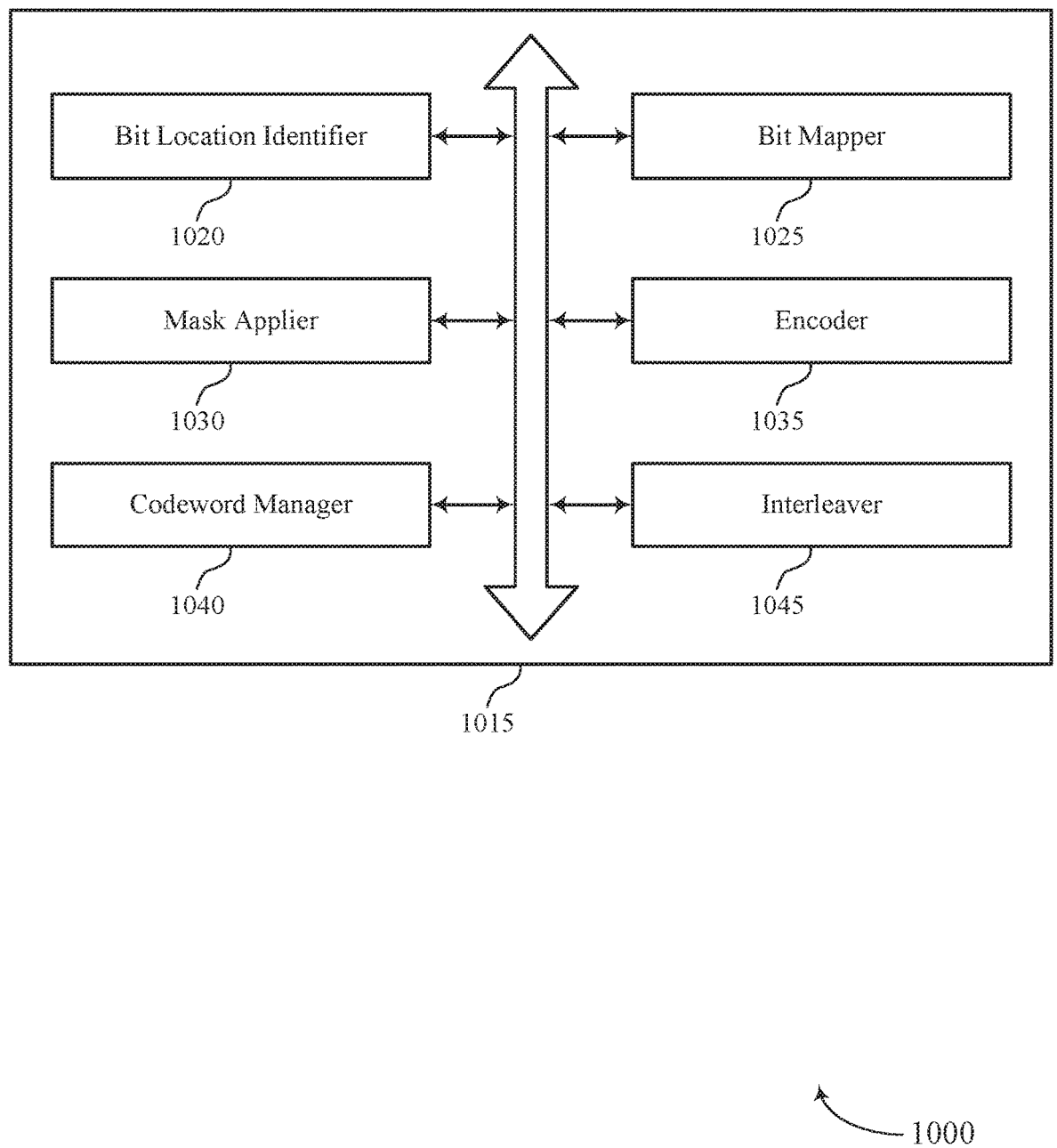
FIG. 10 shows a block diagram of a base station communications manager that supports user-specific scrambling for polar codes in accordance with aspects of the present disclosure.

FIG. 10 shows a block diagram 1000 of a base station communications manager 1015 that supports user-specific scrambling for polar codes in accordance with aspects of the present disclosure. The base station communications manager 1015 may be an example of aspects of a base station communications manager 815, a base station communications manager 915, or a base station communications manager 1015 described with reference to FIGS. 8, 9, and 10. The base station communications manager 1015 may include bit location identifier 1020, bit mapper 1025, mask applier 1030, encoder 1035, codeword manager 1040, and interleaver 1045. Each of these modules may communicate, directly or indirectly, with one another (e.g., via one or more buses).

Bit location identifier 1020 may identify a set of bit locations of a polar code for encoding an input vector based on a reliability order of the bit locations, where the input vector includes a set of payload bits and a set of error detecting check bits.

Bit mapper 1025 may map bits of the input vector to respective bit locations of the set of the bit locations. In some cases, the mapping includes mapping the bits of the input vector to the respective bit locations of the set of the bit locations based on a decoding order of the set of the bit locations.

Mask applier 1030 may apply a masking operation to a subset of bits of the input vector that is mapped to a most reliable subset of the set of the bit locations, where the subset of bits of the input vector includes at least one bit of the set of payload bits. In some cases, a kernel of the masking operation is based on an identifier of the second wireless device. In some cases, the masking operation includes an XOR operation between each bit of the kernel and a corresponding bit of the subset of bits of the input vector. In some cases, the identifier of the second wireless device includes a RNTI.

Encoder 1035 may perform an encoding operation according to the mapped input vector to generate a codeword. Codeword manager 1040 may transmit the codeword to a second wireless device. Interleaver 1045 may interleave the set of payload bits with the set of error detecting check bits to generate the input vector.

Figure 11:
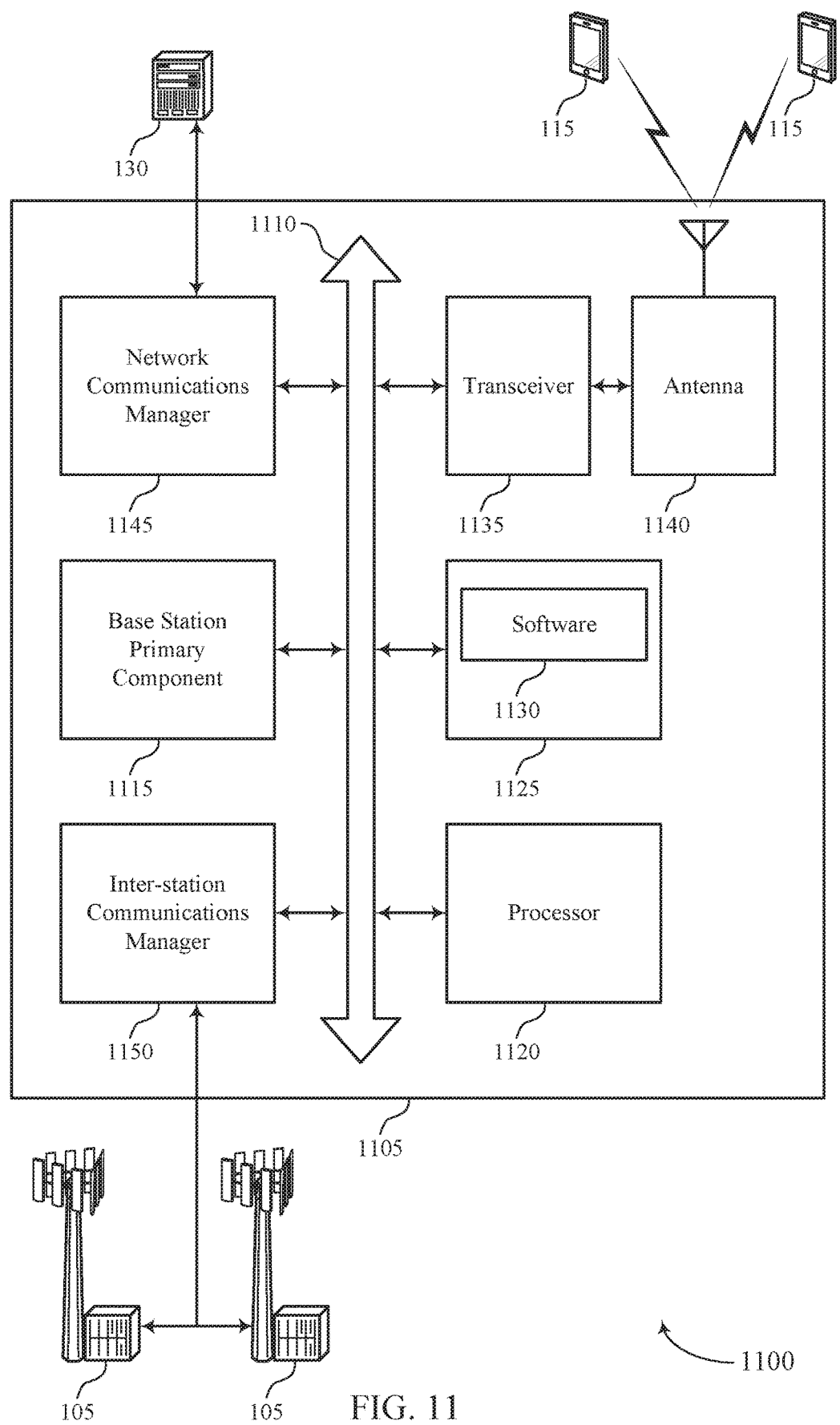
FIG. 11 illustrates a diagram of a system including a base station that supports user-specific scrambling for polar codes in accordance with aspects of the present disclosure.

FIG. 11 shows a diagram of a system 1100 including a device 1105 that supports user-specific scrambling for polar codes in accordance with aspects of the present disclosure. Device 1105 may be an example of or include the components of wireless device 805, wireless device 905, or a base station 105 as described above, e.g., with reference to FIGS. 8 and 9. Device 1105 may include components for bi-directional voice and data communications including components for transmitting and receiving communications, including base station communications manager 1115, processor 1120, memory 1125, software 1130, transceiver 1135, antenna 1140, network communications manager 1145, and inter-station communications manager 1150. These components may be in electronic communication via one or more buses (e.g., bus 1110). Device 1105 may communicate wirelessly with one or more user equipment (UE)s 115.

Processor 1120 may include an intelligent hardware device, (e.g., a general-purpose processor, a DSP, a central processing unit (CPU), a microcontroller, an ASIC, an FPGA, a programmable logic device, a discrete gate or transistor logic component, a discrete hardware component, or any combination thereof). In some cases, processor 1120 may be configured to operate a memory array using a memory controller. In other cases, a memory controller may be integrated into processor 1120. Processor 1120 may be configured to execute computer-readable instructions stored in a memory to perform various functions (e.g., functions or tasks supporting user-specific scrambling for polar codes).

Memory 1125 may include random access memory (RAM) and read only memory (ROM). The memory 1125 may store computer-readable, computer-executable software 1130 including instructions that, when executed, cause the processor to perform various functions described herein. In some cases, the memory 1125 may contain, among other things, a basic input/output system (BIOS) which may control basic hardware or software operation such as the interaction with peripheral components or devices.

Software 1130 may include code to implement aspects of the present disclosure, including code to support user-specific scrambling for polar codes. Software 1130 may be stored in a non-transitory computer-readable medium such as system memory or other memory. In some cases, the software 1130 may not be directly executable by the processor but may cause a computer (e.g., when compiled and executed) to perform functions described herein.

Transceiver 1135 may communicate bi-directionally, via one or more antennas, wired, or wireless links as described above. For example, the transceiver 1135 may represent a wireless transceiver and may communicate bi-directionally with another wireless transceiver. The transceiver 1135 may also include a modem to modulate the packets and provide the modulated packets to the antennas for transmission, and to demodulate packets received from the antennas. In some cases, the wireless device may include a single antenna 1140. However, in some cases the device may have more than one antenna 1140, which may be capable of concurrently transmitting or receiving multiple wireless transmissions.

Network communications manager 1145 may manage communications with the core network (e.g., via one or more wired backhaul links). For example, the network communications manager 1145 may manage the transfer of data communications for client devices, such as one or more UEs 115.

Inter-station communications manager 1150 may manage communications with other base station 105, and may include a controller or scheduler for controlling communications with UEs 115 in cooperation with other base stations 105. For example, the inter-station communications manager 1150 may coordinate scheduling for transmissions to UEs 115 for various interference mitigation techniques such as beamforming or joint transmission. In some examples, inter-station communications manager 1150 may provide an X2 interface within an Long Term Evolution (LTE)/LTE-A wireless communication network technology to provide communication between base stations 105.

Figure 12:
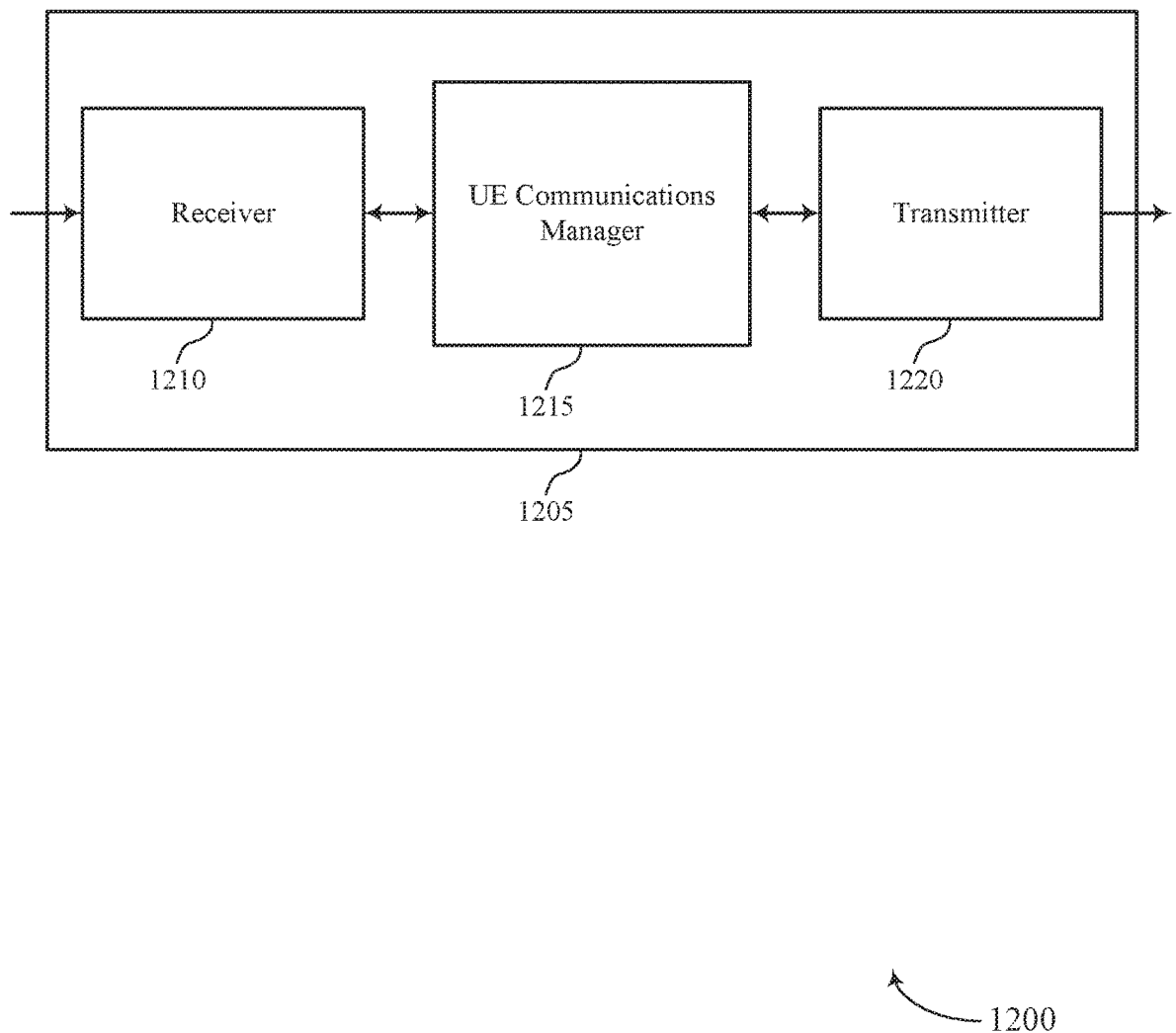
FIGS. 12 and 13 show block diagrams of a wireless device that supports user-specific scrambling for polar codes in accordance with aspects of the present disclosure.

FIG. 12 shows a block diagram 1200 of a wireless device 1205 that supports user-specific scrambling for polar codes in accordance with aspects of the present disclosure. Wireless device 1205 may be an example of aspects of a UE 115 as described herein. Wireless device 1205 may include receiver 1210, UE communications manager 1215, and transmitter 1220. Wireless device 1205 may also include a processor. Each of these components may be in communication with one another (e.g., via one or more buses).

Receiver 1210 may receive information such as packets, user data, or control information associated with various information channels (e.g., control channels, data channels, and information related to user-specific scrambling for polar codes, etc.). Information may be passed on to other components of the device. The receiver 1210 may be an example of aspects of the transceiver 1435 described with reference to FIG. 14. The receiver 1210 may utilize a single antenna or a set of antennas.

UE communications manager 1215 may be an example of aspects of the UE communications manager 1415 described with reference to FIG. 14. UE communications manager 1215 and/or at least some of its various sub-components may be implemented in hardware, software executed by a processor, firmware, or any combination thereof. If implemented in software executed by a processor, the functions of the UE communications manager 1215 and/or at least some of its various sub-components may be executed by a general-purpose processor, a DSP, an ASIC, an FPGA or other programmable logic device, discrete gate or transistor logic, discrete hardware components, or any combination thereof designed to perform the functions described in the present disclosure.

The UE communications manager 1215 and/or at least some of its various sub-components may be physically located at various positions, including being distributed such that portions of functions are implemented at different physical locations by one or more physical devices. In some examples, UE communications manager 1215 and/or at least some of its various sub-components may be a separate and distinct component in accordance with various aspects of the present disclosure. In other examples, UE communications manager 1215 and/or at least some of its various sub-components may be combined with one or more other hardware components, including but not limited to an I/O component, a transceiver, a network server, another computing device, one or more other components described in the present disclosure, or a combination thereof in accordance with various aspects of the present disclosure.

UE communications manager 1215 may receive a codeword from a second wireless device, the codeword generated from an input vector according to a polar code, the input vector including a set of payload bits and a set of error detecting check bits. UE communications manager 1215 identify a set of bit locations of the polar code for decoding the input vector based on a reliability order of the bit locations. UE communications manager 1215 apply a decoding operation to the codeword to generate one or more decoding candidates including respective representations of the input vector. UE communications manager 1215 apply, for each decoding candidate, a masking operation to a subset of bits of the representation of the input vector that is mapped to a most reliable subset of the set of the bit locations, where the subset of bits of the representation of the input vector includes at least one bit of the set of payload bits. UE communications manager 1215 determine a validity of the each decoding candidate based on a result of the masking operation for the each decoding candidate.

Transmitter 1220 may transmit signals generated by other components of the device. In some examples, the transmitter 1220 may be collocated with a receiver 1210 in a transceiver module. For example, the transmitter 1220 may be an example of aspects of the transceiver 1435 described with reference to FIG. 14. The transmitter 1220 may utilize a single antenna or a set of antennas.

Figure 13:
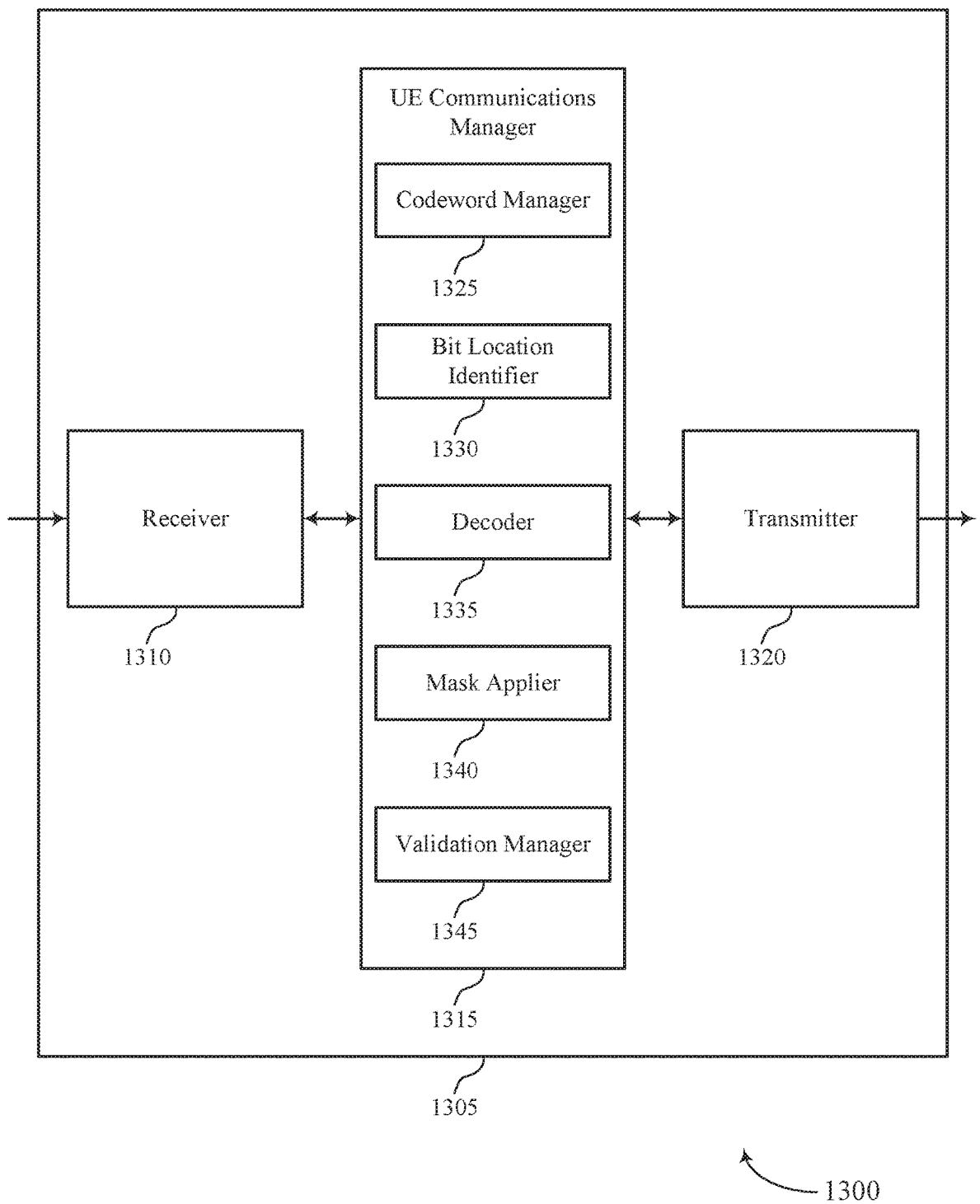

FIG. 13 shows a block diagram 1300 of a wireless device 1305 that supports user-specific scrambling for polar codes in accordance with aspects of the present disclosure. Wireless device 1305 may be an example of aspects of a wireless device 1205 or a UE 115 as described with reference to FIG. 12. Wireless device 1305 may include receiver 1310, UE communications manager 1315, and transmitter 1320. Wireless device 1305 may also include a processor. Each of these components may be in communication with one another (e.g., via one or more buses).

Receiver 1310 may receive information such as packets, user data, or control information associated with various information channels (e.g., control channels, data channels, and information related to user-specific scrambling for polar codes, etc.). Information may be passed on to other components of the device. The receiver 1310 may be an example of aspects of the transceiver 1435 described with reference to FIG. 14. The receiver 1310 may utilize a single antenna or a set of antennas. UE communications manager 1315 may be an example of aspects of the UE communications manager 1415 described with reference to FIG. 14. UE communications manager 1315 may also include codeword manager 1325, bit location identifier 1330, decoder 1335, mask applier 1340, and validation manager 1345.

Codeword manager 1325 may receive a codeword from a second wireless device, the codeword generated from an input vector according to a polar code, the input vector including a set of payload bits and a set of error detecting check bits. Bit location identifier 1330 may identify a set of bit locations of the polar code for decoding the input vector based on a reliability order of the bit locations.

Decoder 1335 may apply a decoding operation to the codeword to generate one or more decoding candidates including respective representations of the input vector. In some cases, the decoding operation includes a list decoding operation and the one or more decoding candidates include a set of decoding candidates.

Mask applier 1340 may apply, for each decoding candidate, a masking operation to a subset of bits of the representation of the input vector that is mapped to a most reliable subset of the set of the bit locations, where the subset of bits of the representation of the input vector includes at least one bit of the set of payload bits. In some cases, a kernel of the masking operation is based on an identifier of the wireless device. In some cases, the masking operation includes an XOR operation between each position of the kernel and a corresponding bit of the subset of bits of the representation of the input vector. In some cases, the identifier of the wireless device includes a RNTI.

Validation manager 1345 may determine a validity of the each decoding candidate based on a result of the masking operation for the each decoding candidate. Transmitter 1320 may transmit signals generated by other components of the device. In some examples, the transmitter 1320 may be collocated with a receiver 1310 in a transceiver module. For example, the transmitter 1320 may be an example of aspects of the transceiver 1435 described with reference to FIG. 14. The transmitter 1320 may utilize a single antenna or a set of antennas.

Figure 14:
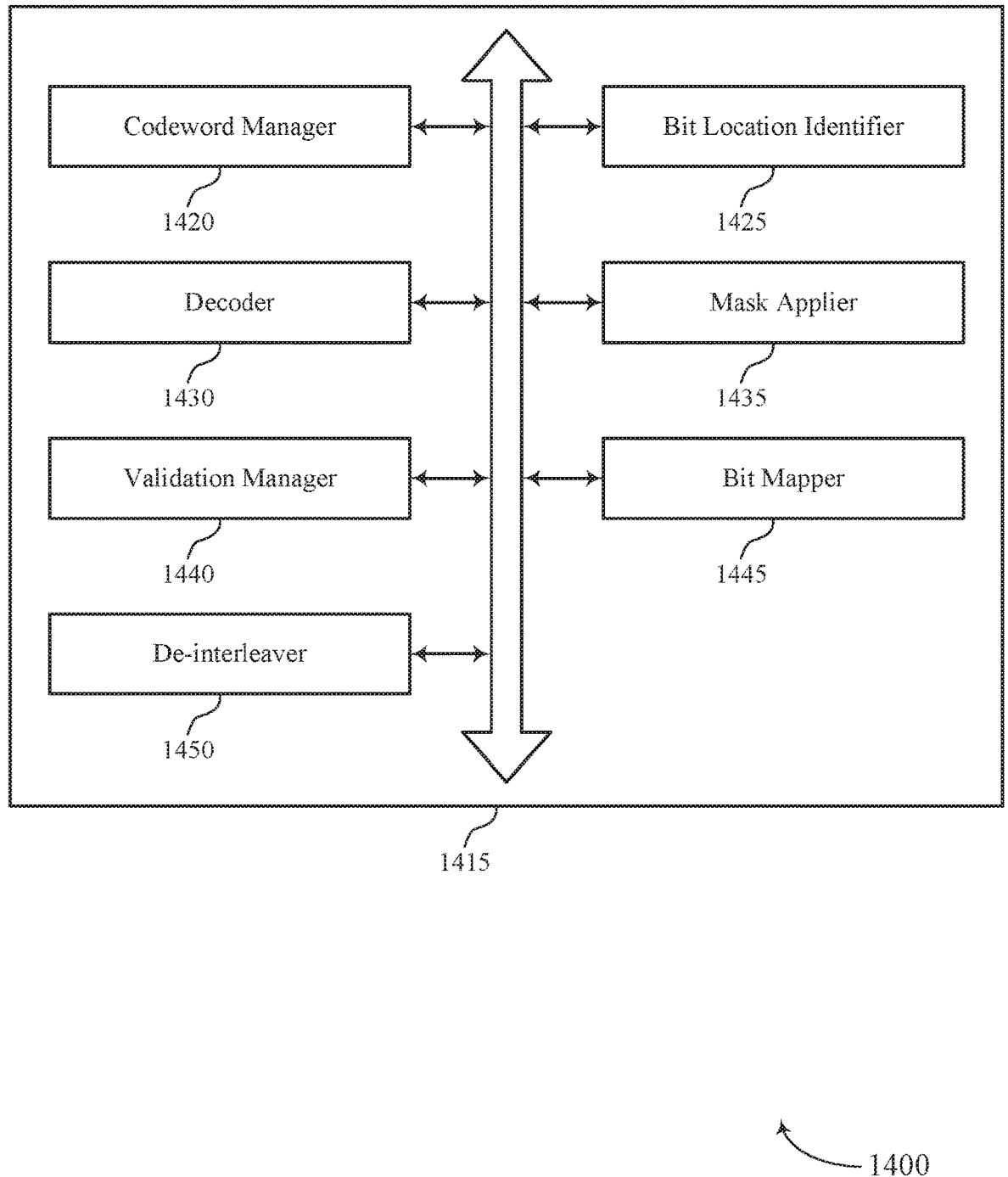
FIG. 14 shows a block diagram of a UE communications manager that supports user-specific scrambling for polar codes in accordance with aspects of the present disclosure.

FIG. 14 shows a block diagram 1400 of a UE communications manager 1415 that supports user-specific scrambling for polar codes in accordance with aspects of the present disclosure. The UE communications manager 1415 may be an example of aspects of a UE communications manager 1415 described with reference to FIGS. 12, 13, and 14. The UE communications manager 1415 may include codeword manager 1420, bit location identifier 1425, decoder 1430, mask applier 1435, validation manager 1440, bit mapper 1445, and de-interleaver 1450. Each of these modules may communicate, directly or indirectly, with one another (e.g., via one or more buses).

Codeword manager 1420 may receive a codeword from a second wireless device, the codeword generated from an input vector according to a polar code, the input vector including a set of payload bits and a set of error detecting check bits. Bit location identifier 1425 may identify a set of bit locations of the polar code for decoding the input vector based on a reliability order of the bit locations.

Decoder 1430 may apply a decoding operation to the codeword to generate one or more decoding candidates including respective representations of the input vector. In some cases, the decoding operation includes a list decoding operation and the one or more decoding candidates include a set of decoding candidates.

Mask applier 1435 may apply, for each decoding candidate, a masking operation to a subset of bits of the representation of the input vector that is mapped to a most reliable subset of the set of the bit locations, where the subset of bits of the representation of the input vector includes at least one bit of the set of payload bits. In some cases, a kernel of the masking operation is based on an identifier of the wireless device. In some cases, the masking operation includes an XOR operation between each position of the kernel and a corresponding bit of the subset of bits of the representation of the input vector. In some cases, the identifier of the wireless device includes a RNTI.

Validation manager 1440 may determine a validity of the each decoding candidate based on a result of the masking operation for the each decoding candidate. Bit mapper 1445 may de-map, for each decoding candidate, bits of the representation of the input vector to obtain a representation of the set of payload bits and a representation of the set of error detecting check bits based on a decoding order of the set of the bit locations. De-interleaver 1450 may deinterleave the representation of the input vector to obtain a representation of the set of payload bits and a representation of the set of error detecting check bits.

Figure 15:
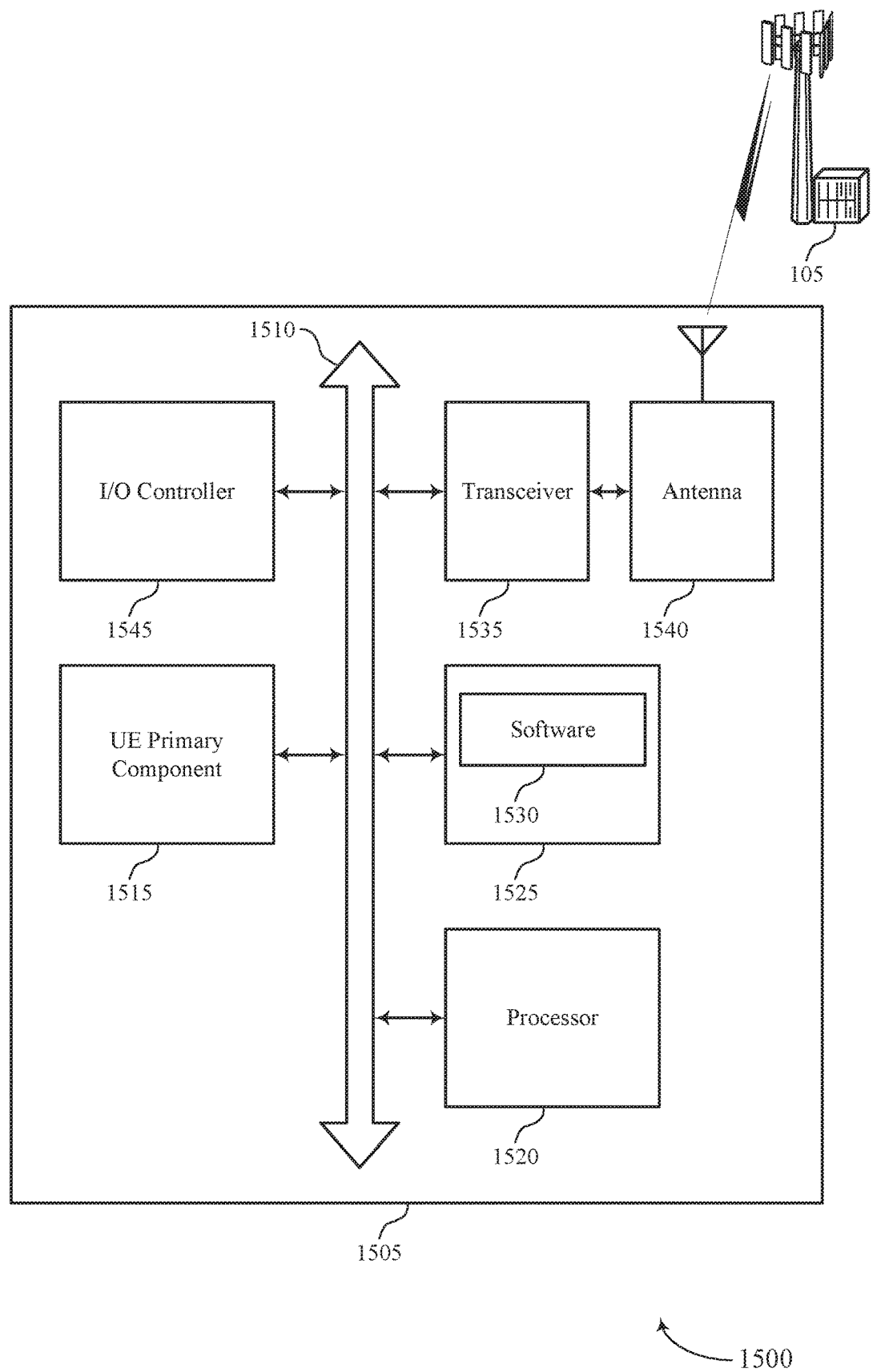
FIG. 15 illustrates a diagram of a system including a UE that supports user-specific scrambling for polar codes in accordance with aspects of the present disclosure.

FIG. 15 shows a diagram of a system 1500 including a device 1505 that supports user-specific scrambling for polar codes in accordance with aspects of the present disclosure. Device 1505 may be an example of or include the components of UE 115 as described above, e.g., with reference to FIG. 1. Device 1505 may include components for bi-directional voice and data communications including components for transmitting and receiving communications, including UE communications manager 1515, processor 1520, memory 1525, software 1530, transceiver 1535, antenna 1540, and I/O controller 1545. These components may be in electronic communication via one or more buses (e.g., bus 1510). Device 1505 may communicate wirelessly with one or more base stations 105.

Processor 1520 may include an intelligent hardware device, (e.g., a general-purpose processor, a DSP, a CPU, a microcontroller, an ASIC, an FPGA, a programmable logic device, a discrete gate or transistor logic component, a discrete hardware component, or any combination thereof). In some cases, processor 1520 may be configured to operate a memory array using a memory controller. In other cases, a memory controller may be integrated into processor 1520. Processor 1520 may be configured to execute computer-readable instructions stored in a memory to perform various functions (e.g., functions or tasks supporting user-specific scrambling for polar codes).

Memory 1525 may include RAM and ROM. The memory 1525 may store computer-readable, computer-executable software 1530 including instructions that, when executed, cause the processor to perform various functions described herein. In some cases, the memory 1525 may contain, among other things, a BIOS which may control basic hardware or software operation such as the interaction with peripheral components or devices.

Software 1530 may include code to implement aspects of the present disclosure, including code to support user-specific scrambling for polar codes. Software 1530 may be stored in a non-transitory computer-readable medium such as system memory or other memory. In some cases, the software 1530 may not be directly executable by the processor but may cause a computer (e.g., when compiled and executed) to perform functions described herein.

Transceiver 1535 may communicate bi-directionally, via one or more antennas, wired, or wireless links as described above. For example, the transceiver 1535 may represent a wireless transceiver and may communicate bi-directionally with another wireless transceiver. The transceiver 1535 may also include a modem to modulate the packets and provide the modulated packets to the antennas for transmission, and to demodulate packets received from the antennas. In some cases, the wireless device may include a single antenna 1540. However, in some cases the device may have more than one antenna 1540, which may be capable of concurrently transmitting or receiving multiple wireless transmissions.

I/O controller 1545 may manage input and output signals for device 1505. I/O controller 1545 may also manage peripherals not integrated into device 1505. In some cases, I/O controller 1545 may represent a physical connection or port to an external peripheral. In some cases, I/O controller 1545 may utilize an operating system such as iOS®, ANDROID®, MS-DOS®, MS-WINDOWS®, OS/2®, UNIX®, LINUX®, or another known operating system. In other cases, I/O controller 1545 may represent or interact with a modem, a keyboard, a mouse, a touchscreen, or a similar device. In some cases, I/O controller 1545 may be implemented as part of a processor. In some cases, a user may interact with device 1505 via I/O controller 1545 or via hardware components controlled by I/O controller 1545.

Figure 16:
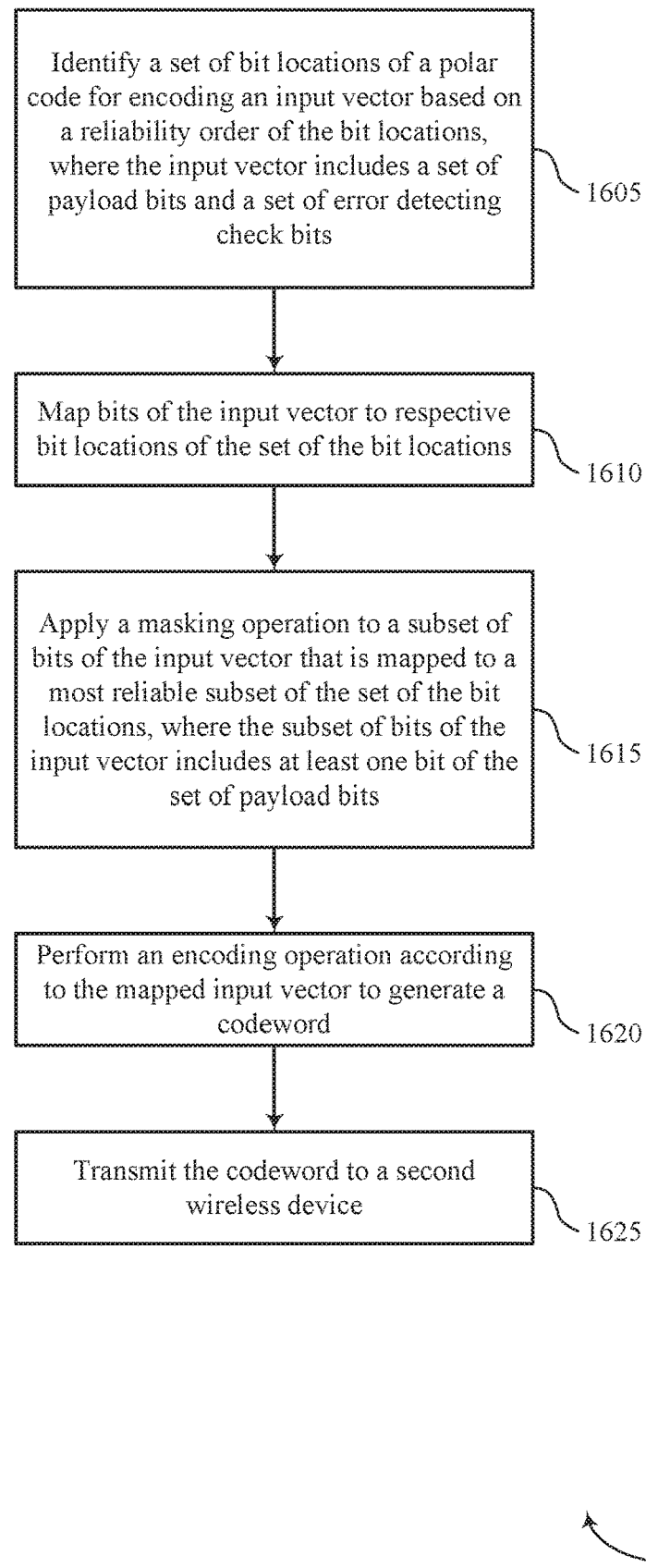
FIGS. 16 through 19 illustrate methods for user-specific scrambling for polar codes in accordance with aspects of the present disclosure.

FIG. 16 shows a flowchart illustrating a method 1600 for user-specific scrambling for polar codes in accordance with aspects of the present disclosure. The operations of method 1600 may be implemented by a base station 105 or its components as described herein. For example, the operations of method 1600 may be performed by a base station communications manager as described with reference to FIGS. 8 through 11. In some examples, a base station 105 may execute a set of codes to control the functional elements of the device to perform the functions described below. Additionally or alternatively, the base station 105 may perform aspects of the functions described below using special-purpose hardware.

At 1605 the base station 105 may identify a set of bit locations of a polar code for encoding an input vector based at least in part on a reliability order of the bit locations, wherein the input vector comprises a set of payload bits and a set of error detecting check bits. The operations of 1605 may be performed according to the methods described herein. In certain examples, aspects of the operations of 1605 may be performed by a bit location identifier as described with reference to FIGS. 8 through 11.

At 1610 the base station 105 may map bits of the input vector to respective bit locations of the set of the bit locations. The operations of 1610 may be performed according to the methods described herein. In certain examples, aspects of the operations of 1610 may be performed by a bit mapper as described with reference to FIGS. 8 through 11.

At 1615 the base station 105 may apply a masking operation to a subset of bits of the input vector that is mapped to a most reliable subset of the set of the bit locations, wherein the subset of bits of the input vector comprises at least one bit of the set of payload bits. The operations of 1615 may be performed according to the methods described herein. In certain examples, aspects of the operations of 1615 may be performed by a mask applier as described with reference to FIGS. 8 through 11.

At 1620 the base station 105 may perform an encoding operation according to the mapped input vector to generate a codeword. The operations of 1620 may be performed according to the methods described herein. In certain examples, aspects of the operations of 1620 may be performed by an encoder as described with reference to FIGS. 8 through 11.

At 1625 the base station 105 may transmit the codeword to a second wireless device. The operations of 1625 may be performed according to the methods described herein. In certain examples, aspects of the operations of 1625 may be performed by a codeword manager as described with reference to FIGS. 8 through 11.

Figure 17:
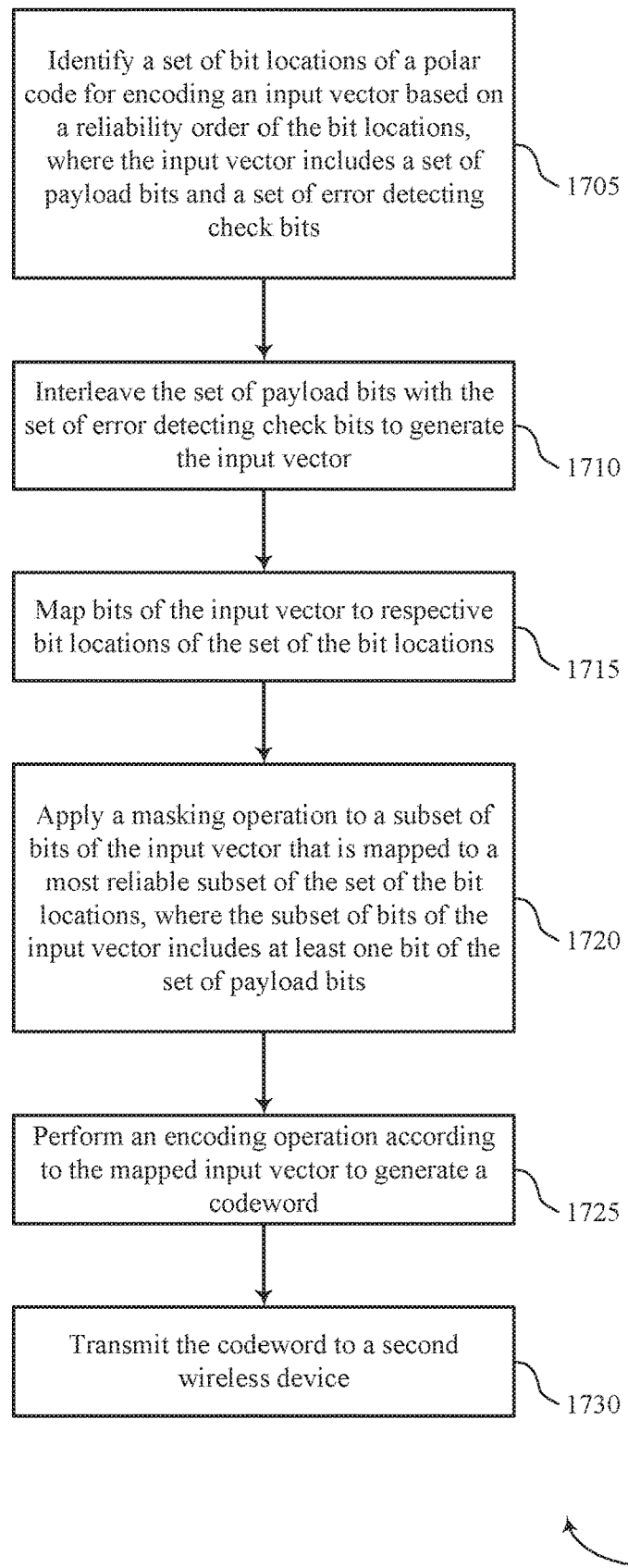

FIG. 17 shows a flowchart illustrating a method 1700 for user-specific scrambling for polar codes in accordance with aspects of the present disclosure. The operations of method 1700 may be implemented by a base station 105 or its components as described herein. For example, the operations of method 1700 may be performed by a base station communications manager as described with reference to FIGS. 8 through 11. In some examples, a base station 105 may execute a set of codes to control the functional elements of the device to perform the functions described below. Additionally or alternatively, the base station 105 may perform aspects of the functions described below using special-purpose hardware.

At 1705 the base station 105 may identify a set of bit locations of a polar code for encoding an input vector based at least in part on a reliability order of the bit locations, wherein the input vector comprises a set of payload bits and a set of error detecting check bits. The operations of 1705 may be performed according to the methods described herein. In certain examples, aspects of the operations of 1705 may be performed by a bit location identifier as described with reference to FIGS. 8 through 11.

At 1710 the base station 105 may interleave the set of payload bits with the set of error detecting check bits to generate the input vector. The operations of 1710 may be performed according to the methods described herein. In certain examples, aspects of the operations of 1710 may be performed by a interleaver as described with reference to FIGS. 8 through 11.

At 1715 the base station 105 may map bits of the input vector to respective bit locations of the set of the bit locations. The operations of 1715 may be performed according to the methods described herein. In certain examples, aspects of the operations of 1715 may be performed by a bit mapper as described with reference to FIGS. 8 through 11.

At 1720 the base station 105 may apply a masking operation to a subset of bits of the input vector that is mapped to a most reliable subset of the set of the bit locations, wherein the subset of bits of the input vector comprises at least one bit of the set of payload bits. The operations of 1720 may be performed according to the methods described herein. In certain examples, aspects of the operations of 1720 may be performed by a mask applier as described with reference to FIGS. 8 through 11.

At 1725 the base station 105 may perform an encoding operation according to the mapped input vector to generate a codeword. The operations of 1725 may be performed according to the methods described herein. In certain examples, aspects of the operations of 1725 may be performed by an encoder as described with reference to FIGS. 8 through 11.

At 1730 the base station 105 may transmit the codeword to a second wireless device. The operations of 1730 may be performed according to the methods described herein. In certain examples, aspects of the operations of 1730 may be performed by a codeword manager as described with reference to FIGS. 8 through 11.

Figure 18:
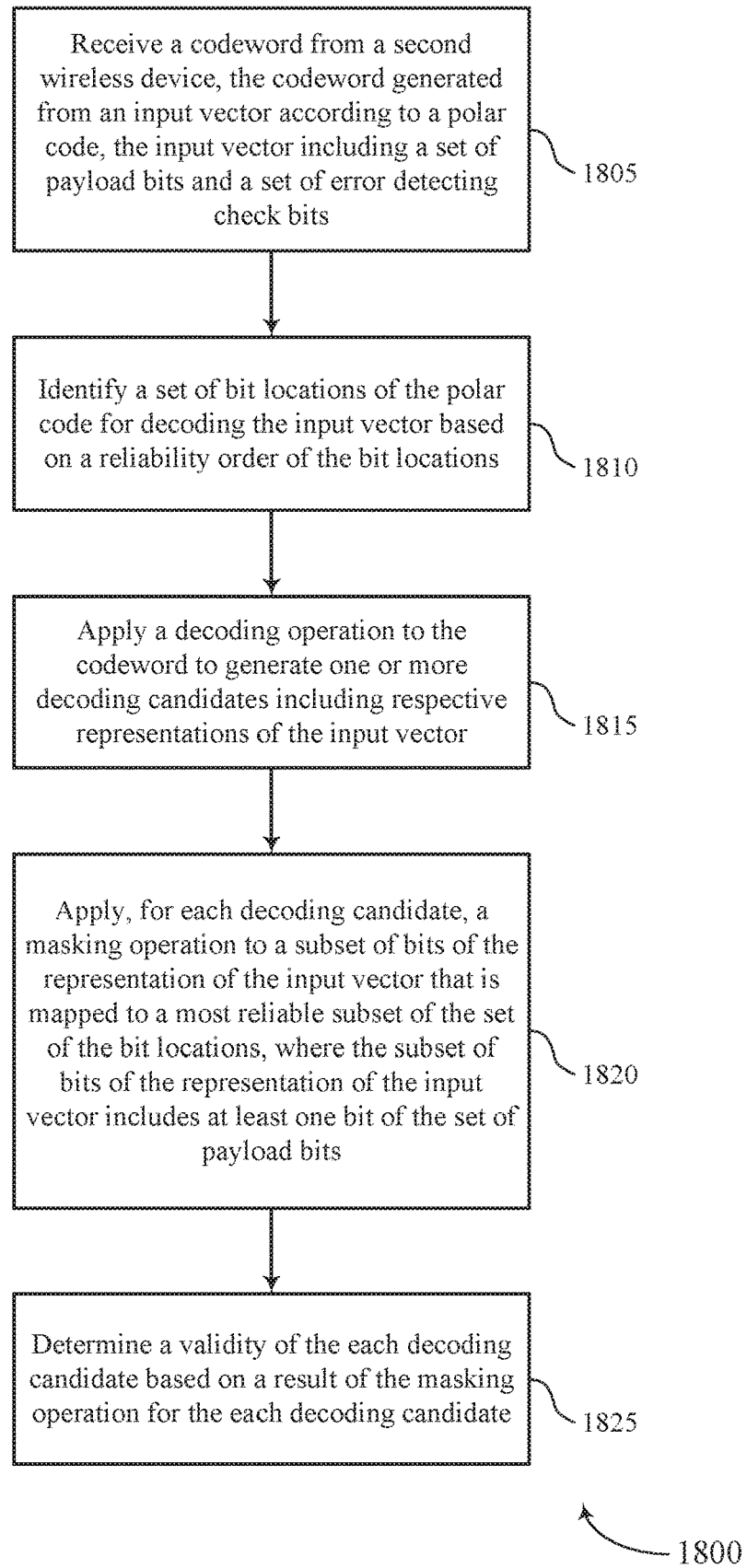

FIG. 18 shows a flowchart illustrating a method 1800 for user-specific scrambling for polar codes in accordance with aspects of the present disclosure. The operations of method 1800 may be implemented by a UE 115 or its components as described herein. For example, the operations of method 1800 may be performed by a UE communications manager as described with reference to FIGS. 12 through 15. In some examples, a UE 115 may execute a set of codes to control the functional elements of the device to perform the functions described below. Additionally or alternatively, the UE 115 may perform aspects of the functions described below using special-purpose hardware.

At 1805 the UE 115 may receive a codeword from a second wireless device, the codeword generated from an input vector according to a polar code, the input vector comprising a set of payload bits and a set of error detecting check bits. The operations of 1805 may be performed according to the methods described herein. In certain examples, aspects of the operations of 1805 may be performed by a codeword manager as described with reference to FIGS. 12 through 15.

At 1810 the UE 115 may identify a set of bit locations of the polar code for decoding the input vector based at least in part on a reliability order of the bit locations. The operations of 1810 may be performed according to the methods described herein. In certain examples, aspects of the operations of 1810 may be performed by a bit location identifier as described with reference to FIGS. 12 through 15.

At 1815 the UE 115 may apply a decoding operation to the codeword to generate one or more decoding candidates comprising respective representations of the input vector. The operations of 1815 may be performed according to the methods described herein. In certain examples, aspects of the operations of 1815 may be performed by a decoder as described with reference to FIGS. 12 through 15.

At 1820 the UE 115 may apply, for each decoding candidate, a masking operation to a subset of bits of the representation of the input vector that is mapped to a most reliable subset of the set of the bit locations, wherein the subset of bits of the representation of the input vector comprises at least one bit of the set of payload bits. The operations of 1820 may be performed according to the methods described herein. In certain examples, aspects of the operations of 1820 may be performed by a mask applier as described with reference to FIGS. 12 through 15.

At 1825 the UE 115 may determine a validity of the each decoding candidate based at least in part on a result of the masking operation for the each decoding candidate. The operations of 1825 may be performed according to the methods described herein. In certain examples, aspects of the operations of 1825 may be performed by a validation manager as described with reference to FIGS. 12 through 15.

Figure 19:
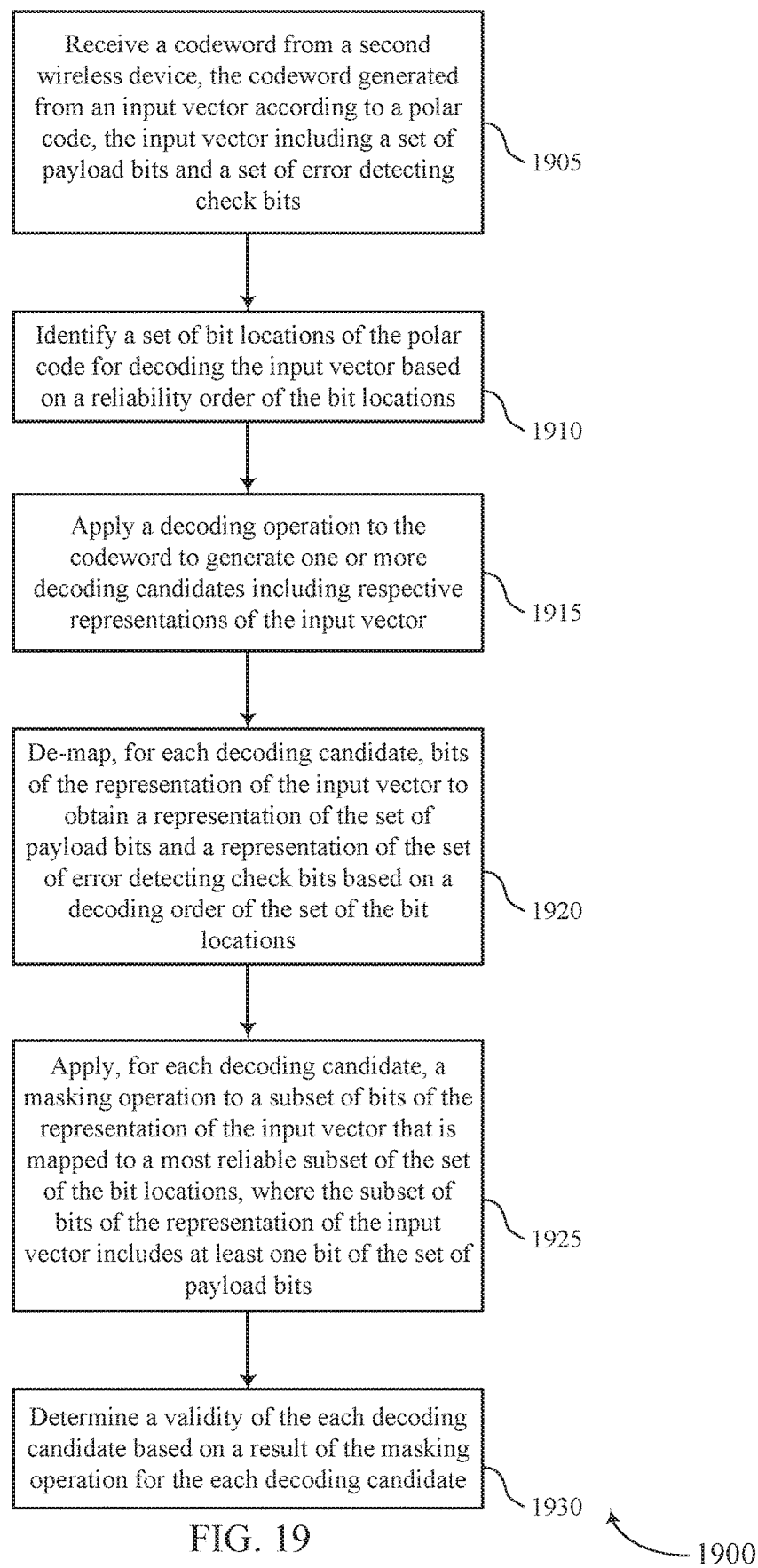

FIG. 19 shows a flowchart illustrating a method 1900 for user-specific scrambling for polar codes in accordance with aspects of the present disclosure. The operations of method 1900 may be implemented by a UE 115 or its components as described herein. For example, the operations of method 1900 may be performed by a UE communications manager as described with reference to FIGS. 12 through 15. In some examples, a UE 115 may execute a set of codes to control the functional elements of the device to perform the functions described below. Additionally or alternatively, the UE 115 may perform aspects of the functions described below using special-purpose hardware.

At 1905 the UE 115 may receive a codeword from a second wireless device, the codeword generated from an input vector according to a polar code, the input vector comprising a set of payload bits and a set of error detecting check bits. The operations of 1905 may be performed according to the methods described herein. In certain examples, aspects of the operations of 1905 may be performed by a codeword manager as described with reference to FIGS. 12 through 15.

At 1910 the UE 115 may identify a set of bit locations of the polar code for decoding the input vector based at least in part on a reliability order of the bit locations. The operations of 1910 may be performed according to the methods described herein. In certain examples, aspects of the operations of 1910 may be performed by a bit location identifier as described with reference to FIGS. 12 through 15.

At 1915 the UE 115 may apply a decoding operation to the codeword to generate one or more decoding candidates comprising respective representations of the input vector. The operations of 1915 may be performed according to the methods described herein. In certain examples, aspects of the operations of 1915 may be performed by a decoder as described with reference to FIGS. 12 through 15.

At 1920 the UE 115 may de-map, for each decoding candidate, bits of the representation of the input vector to obtain a representation of the set of payload bits and a representation of the set of error detecting check bits based at least in part on a decoding order of the set of the bit locations. The operations of 1920 may be performed according to the methods described herein. In certain examples, aspects of the operations of 1920 may be performed by a bit mapper as described with reference to FIGS. 12 through 15.

At 1925 the UE 115 may apply, for each decoding candidate, a masking operation to a subset of bits of the representation of the input vector that is mapped to a most reliable subset of the set of the bit locations, wherein the subset of bits of the representation of the input vector comprises at least one bit of the set of payload bits. The operations of 1925 may be performed according to the methods described herein. In certain examples, aspects of the operations of 1925 may be performed by a mask applier as described with reference to FIGS. 12 through 15.

At 1930 the UE 115 may determine a validity of the each decoding candidate based at least in part on a result of the masking operation for the each decoding candidate. The operations of 1930 may be performed according to the methods described herein. In certain examples, aspects of the operations of 1930 may be performed by a validation manager as described with reference to FIGS. 12 through 15.

It should be noted that the methods described above describe possible implementations, and that the operations and the steps may be rearranged or otherwise modified and that other implementations are possible. Further, aspects from two or more of the methods may be combined.

Techniques described herein may be used for various wireless communications systems such as code division multiple access (CDMA), time division multiple access (TDMA), frequency division multiple access (FDMA), orthogonal frequency division multiple access (OFDMA), single carrier frequency division multiple access (SC-FDMA), and other systems. A CDMA system may implement a radio technology such as CDMA2000, Universal Terrestrial Radio Access (UTRA), etc. CDMA2000 covers IS-2000, IS-95, and IS-856 standards. IS-2000 Releases may be commonly referred to as CDMA2000 1x, 1x, etc. IS-856 (TIA-856) is commonly referred to as CDMA2000 1×EV-DO, High Rate Packet Data (HRPD), etc. UTRA includes Wideband CDMA (WCDMA) and other variants of CDMA. A TDMA system may implement a radio technology such as Global System for Mobile Communications (GSM).

An OFDMA system may implement a radio technology such as Ultra Mobile Broadband (UMB), Evolved UTRA (E-UTRA), Institute of Electrical and Electronics Engineers (IEEE) 802.11 (Wi-Fi), IEEE 802.16 (WiMAX), IEEE 802.20, Flash-OFDM, etc. UTRA and E-UTRA are part of Universal Mobile Telecommunications System (UMTS). LTE and LTE-A are releases of UMTS that use E-UTRA. UTRA, E-UTRA, UMTS, LTE, LTE-A, NR, and GSM are described in documents from the organization named "3rd Generation Partnership Project" (3GPP). CDMA2000 and UMB are described in documents from an organization named "3rd Generation Partnership Project 2" (3GPP2). The techniques described herein may be used for the systems and radio technologies mentioned above as well as other systems and radio technologies. While aspects of an LTE or an NR system may be described for purposes of example, and LTE or NR terminology may be used in much of the description, the techniques described herein are applicable beyond LTE or NR applications.

A macro cell generally covers a relatively large geographic area (e.g., several kilometers in radius) and may allow unrestricted access by UEs 115 with service subscriptions with the network provider. A small cell may be associated with a lower-powered base station 105, as compared with a macro cell, and a small cell may operate in the same or different (e.g., licensed, unlicensed, etc.) frequency bands as macro cells. Small cells may include pico cells, femto cells, and micro cells according to various examples. A pico cell, for example, may cover a small geographic area and may allow unrestricted access by UEs 115 with service subscriptions with the network provider. A femto cell may also cover a small geographic area (e.g., a home) and may provide restricted access by UEs 115 having an association with the femto cell (e.g., UEs 115 in a closed subscriber group (CSG), UEs 115 for users in the home, and the like). An eNB for a macro cell may be referred to as a macro eNB. An eNB for a small cell may be referred to as a small cell eNB, a pico eNB, a femto eNB, or a home eNB. An eNB may support one or multiple (e.g., two, three, four, and the like) cells, and may also support communications using one or multiple component carriers.

The wireless communications system 100 or systems described herein may support synchronous or asynchronous operation. For synchronous operation, the base stations 105 may have similar frame timing, and transmissions from different base stations 105 may be approximately aligned in time. For asynchronous operation, the base stations 105 may have different frame timing, and transmissions from different base stations 105 may not be aligned in time. The techniques described herein may be used for either synchronous or asynchronous operations.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a digital signal processor (DSP), an application-specific integrated circuit (ASIC), a field-programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations.

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media may comprise random-access memory (RAM), read-only memory (ROM), electrically erasable programmable read only memory (EEPROM), flash memory, compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

As used herein, including in the claims, "or" as used in a list of items (e.g., a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label, or other subsequent reference label.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method for wireless communication at a wireless device, comprising:
   identifying a set of bit locations of a polar code for encoding an input vector based at least in part on a reliability order of the bit locations, wherein the input vector comprises a set of payload bits and a set of error detecting check bits;
   mapping bits of the input vector to respective bit locations of the set of the bit locations;
   applying a masking operation to a subset of bits of the input vector that is mapped to a most reliable subset of the set of the bit locations, wherein the subset of bits of the input vector comprises at least one bit of the set of payload bits;
   performing an encoding operation according to the mapped input vector to generate a codeword; and
   transmitting the codeword to a second wireless device.

2. The method of claim 1, further comprising:
   interleaving the set of payload bits with the set of error detecting check bits to generate the input vector.

3. The method of claim 1, wherein the mapping comprises:
   mapping the bits of the input vector to the respective bit locations of the set of the bit locations based at least in part on a decoding order of the set of the bit locations.

4. The method of claim 1, wherein a kernel of the masking operation is based at least in part on an identifier of the second wireless device.

5. The method of claim 4, wherein the masking operation comprises an exclusive-or (XOR) operation between each bit of the kernel and a corresponding bit of the subset of bits of the input vector.

6. The method of claim 4, wherein the identifier of the second wireless device comprises a radio network temporary identifier (RNTI).

7. A method for wireless communication at a wireless device, comprising:
   receiving a codeword from a second wireless device, the codeword generated from an input vector according to a polar code, the input vector comprising a set of payload bits and a set of error detecting check bits;
   identifying a set of bit locations of the polar code for decoding the input vector based at least in part on a reliability order of the bit locations;
   applying a decoding operation to the codeword to generate one or more decoding candidates comprising respective representations of the input vector;
   applying, for each decoding candidate, a masking operation to a subset of bits of the representation of the input vector that is mapped to a most reliable subset of the set of the bit locations, wherein the subset of bits of the representation of the input vector comprises at least one bit of the set of payload bits; and
   determining a validity of the each decoding candidate based at least in part on a result of the masking operation for the each decoding candidate.

8. The method of claim 7, wherein the decoding operation comprises a list decoding operation and the one or more decoding candidates comprise a plurality of decoding candidates.

9. The method of claim 7, further comprising:
   de-mapping, for each decoding candidate, bits of the representation of the input vector to obtain a representation of the set of payload bits and a representation of the set of error detecting check bits based at least in part on a decoding order of the set of the bit locations.

10. The method of claim 7, further comprising:
    deinterleaving the representation of the input vector to obtain a representation of the set of payload bits and a representation of the set of error detecting check bits.

11. The method of claim 7, wherein a kernel of the masking operation is based at least in part on an identifier of the wireless device.

12. The method of claim 11, wherein the masking operation comprises an exclusive-or (XOR) operation between each position of the kernel and a corresponding bit of the subset of bits of the representation of the input vector.

13. The method of claim 11, wherein the identifier of the wireless device comprises a radio network temporary identifier (RNTI).

14. An apparatus for wireless communication, comprising:
means for identifying a set of bit locations of a polar code for encoding an input vector based at least in part on a reliability order of the bit locations, wherein the input vector comprises a set of payload bits and a set of error detecting check bits;
means for mapping bits of the input vector to respective bit locations of the set of the bit locations;
means for applying a masking operation to a subset of bits of the input vector that is mapped to a most reliable subset of the set of the bit locations, wherein the subset of bits of the input vector comprises at least one bit of the set of payload bits;
means for performing an encoding operation according to the mapped input vector to generate a codeword; and
means for transmitting the codeword to a second wireless device.

15. The apparatus of claim 14, further comprising:
means for interleaving the set of payload bits with the set of error detecting check bits to generate the input vector.

16. The apparatus of claim 14, wherein the means for mapping comprises:
means for mapping the bits of the input vector to the respective bit locations of the set of the bit locations based at least in part on a decoding order of the set of the bit locations.

17. The apparatus of claim 14, wherein a kernel of the masking operation is based at least in part on an identifier of the second wireless device.

18. The apparatus of claim 17, wherein the masking operation comprises an exclusive-or (XOR) operation between each bit of the kernel and a corresponding bit of the subset of bits of the input vector.

19. The apparatus of claim 17, wherein the identifier of the second wireless device comprises a radio network temporary identifier (RNTI).

20. An apparatus for wireless communication, comprising:
means for receiving a codeword from a second wireless device, the codeword generated from an input vector according to a polar code, the input vector comprising a set of payload bits and a set of error detecting check bits;
means for identifying a set of bit locations of the polar code for decoding the input vector based at least in part on a reliability order of the bit locations;
means for applying a decoding operation to the codeword to generate one or more decoding candidates comprising respective representations of the input vector;
means for applying, for each decoding candidate, a masking operation to a subset of bits of the representation of the input vector that is mapped to a most reliable subset of the set of the bit locations, wherein the subset of bits of the representation of the input vector comprises at least one bit of the set of payload bits; and
means for determining a validity of the each decoding candidate based at least in part on a result of the masking operation for the each decoding candidate.

21. The apparatus of claim 20, wherein the decoding operation comprises a list decoding operation and the one or more decoding candidates comprise a plurality of decoding candidates.

22. The apparatus of claim 20, further comprising:
means for de-mapping, for each decoding candidate, bits of the representation of the input vector to obtain a representation of the set of payload bits and a representation of the set of error detecting check bits based at least in part on a decoding order of the set of the bit locations.

23. The apparatus of claim 20, further comprising:
means for deinterleaving the representation of the input vector to obtain a representation of the set of payload bits and a representation of the set of error detecting check bits.

24. The apparatus of claim 20, wherein a kernel of the masking operation is based at least in part on an identifier of the apparatus.

25. The apparatus of claim 24, wherein the masking operation comprises an exclusive-or (XOR) operation between each position of the kernel and a corresponding bit of the subset of bits of the representation of the input vector.

26. The apparatus of claim 24, wherein the identifier of the apparatus comprises a radio network temporary identifier (RNTI).

27. An apparatus for wireless communication, comprising:
a processor;
memory in electronic communication with the processor; and
instructions stored in the memory and executable by the processor to cause the apparatus to:
identify a set of bit locations of a polar code for encoding an input vector based at least in part on a reliability order of the bit locations, wherein the input vector comprises a set of payload bits and a set of error detecting check bits;
map bits of the input vector to respective bit locations of the set of the bit locations;
apply a masking operation to a subset of bits of the input vector that is mapped to a most reliable subset of the set of the bit locations, wherein the subset of bits of the input vector comprises at least one bit of the set of payload bits;
perform an encoding operation according to the mapped input vector to generate a codeword; and
transmit the codeword to a second wireless device.

28. The apparatus of claim 27, wherein the instructions are further executable by the processor to cause the apparatus to:
interleave the set of payload bits with the set of error detecting check bits to generate the input vector.

29. The apparatus of claim 27, wherein the instructions to map bits of the input vector are executable by the processor to cause the apparatus to:
map the bits of the input vector to the respective bit locations of the set of the bit locations based at least in part on a decoding order of the set of the bit locations.

30. The apparatus of claim 27, wherein a kernel of the masking operation is based at least in part on an identifier of the second wireless device.

31. The apparatus of claim 30, wherein the masking operation comprises an exclusive-or (XOR) operation between each bit of the kernel and a corresponding bit of the subset of bits of the input vector.

32. The apparatus of claim 30, wherein the identifier of the second wireless device comprises a radio network temporary identifier (RNTI).

33. An apparatus for ireless communication, comprising:
a processor;
memory in electronic communication with the processor; and
instructions stored in the memory and executable by the processor to cause the apparatus to:
receive a codeword from a second wireless device, the codeword generated from an input vector according to a polar code, the input vector comprising a set of payload bits and a set of error detecting check bits;
identify a set of bit locations of the polar code for decoding the input vector based at least in part on a reliability order of the bit locations;
apply a decoding operation to the codeword to generate one or more decoding candidates comprising respective representations of the input vector;
apply, for each decoding candidate, a masking operation to a subset of bits of the representation of the input vector that is mapped to a most reliable subset of the set of the bit locations, wherein the subset of bits of the representation of the input vector comprises at least one bit of the set of payload bits; and
determine a validity of the each decoding candidate based at least in part on a result of the masking operation for the each decoding candidate.

34. The apparatus of claim 33, wherein the decoding operation comprises a list decoding operation and the one or more decoding candidates comprise a plurality of decoding candidates.

35. The apparatus of claim 33, wherein the instructions are further executable by the processor to cause the apparatus to:
de-map, for each decoding candidate, bits of the representation of the input vector to obtain a representation of the set of payload bits and a representation of the set of error detecting check bits based at least in part on a decoding order of the set of the bit locations.

36. The apparatus of claim 33, wherein the instructions are further executable by the processor to cause the apparatus to:
deinterleave the representation of the input vector to obtain a representation of the set of payload bits and a representation of the set of error detecting check bits.

37. The apparatus of claim 33, wherein a kernel of the masking operation is based at least in part on an identifier of the apparatus.

38. The apparatus of claim 37, wherein the masking operation comprises an exclusive-or (XOR) operation between each position of the kernel and a corresponding bit of the subset of bits of the representation of the input vector.

39. The apparatus of claim 37, wherein the identifier of the apparatus comprises a radio network temporary identifier (RNTI).

40. A non-transitory computer-readable medium storing code for wireless communication, the code comprising instructions executable by a processor to:
identify a set of bit locations of a polar code for encoding an input vector based at least in part on a reliability order of the bit locations, wherein the input vector comprises a set of payload bits and a set of error detecting check bits;
map bits of the input vector to respective bit locations of the set of the bit locations;
apply a masking operation to a subset of bits of the input vector that is mapped to a most reliable subset of the set of the bit locations, wherein the subset of bits of the input vector comprises at least one bit of the set of payload bits;
perform an encoding operation according to the mapped input vector to generate a codeword; and
transmit the codeword to a second wireless device.

41. The non-transitory computer-readable medium of claim 40, wherein the instructions are further executable by the processor to:
interleave the set of payload bits with the set of error detecting check bits to generate the input vector.

42. The non-transitory computer-readable medium of claim 40, wherein the instructions to map the bits are executable by the processor to:
map the bits of the input vector to the respective bit locations of the set of the bit locations based at least in part on a decoding order of the set of the bit locations.

43. The non-transitory computer-readable medium of claim 40, wherein a kernel of the masking operation is based at least in part on an identifier of the second wireless device.

44. The non-transitory computer-readable medium of claim 43, wherein the masking operation comprises an exclusive-or (XOR) operation between each bit of the kernel and a corresponding bit of the subset of bits of the input vector.

45. The non-transitory computer-readable medium of claim 43, wherein the identifier of the second wireless device comprises a radio network temporary identifier (RNTI).

46. A non-transitory computer-readable medium storing code for wireless communication, the code comprising instructions executable by a processor to:
receive a codeword from a second wireless device, the codeword generated from an input vector according to a polar code, the input vector comprising a set of payload bits and a set of error detecting check bits;
identify a set of bit locations of the polar code for decoding the input vector based at least in part on a reliability order of the bit locations;
apply a decoding operation to the codeword to generate one or more decoding candidates comprising respective representations of the input vector;
apply, for each decoding candidate, a masking operation to a subset of bits of the representation of the input vector that is mapped to a most reliable subset of the set of the bit locations, wherein the subset of bits of the representation of the input vector comprises at least one bit of the set of payload bits; and
determine a validity of the each decoding candidate based at least in part on a result of the masking operation for the each decoding candidate.

47. The non-transitory computer-readable medium of claim 46, wherein the decoding operation comprises a list decoding operation and the one or more decoding candidates comprise a plurality of decoding candidates.

48. The non-transitory computer-readable medium of claim 46, wherein the instructions are further executable by the processor to:
de-map, for each decoding candidate, bits of the representation of the input vector to obtain a representation of the set of payload bits and a representation of the set of error detecting check bits based at least in part on a decoding order of the set of the bit locations.

49. The non-transitory computer-readable medium of claim 46, wherein the instructions are further executable by the processor to:
   deinterleave the representation of the input vector to obtain a representation of the set of payload bits and a representation of the set of error detecting check bits.

50. The non-transitory computer-readable medium of claim 46, wherein a kernel of the masking operation is based at least in part on an identifier of a wireless device.

51. The non-transitory computer-readable medium of claim 50, wherein the masking operation comprises an exclusive-or (XOR) operation between each position of the kernel and a corresponding bit of the subset of bits of the representation of the input vector.

52. The non-transitory computer-readable medium of claim 50, wherein the identifier of the wireless device comprises a radio network temporary identifier (RNTI).

* * * * *